US012615775B2

(12) United States Patent
Wu et al.

(10) Patent No.: US 12,615,775 B2
(45) Date of Patent: Apr. 28, 2026

(54) BACKSIDE GATE LINE SLIT STRUCTURE TO REDUCE WAFER BOW IN A THREE-DIMENSIONAL MEMORY DEVICE COMPRISING BONDED DEVICES

(71) Applicant: Yangtze Memory Technologies Co., Ltd., Wuhan (CN)

(72) Inventors: Shuangshuang Wu, Wuhan (CN); Kun Zhang, Wuhan (CN); Wenxi Zhou, Wuhan (CN); ZhiLiang Xia, Wuhan (CN); ZongLiang Huo, Wuhan (CN)

(73) Assignee: Yangzte Memory Technologies Co., Ltd., Wuhan (CN)

( * ) Notice: Subject to any disclaimer, the term of this patent is extended or adjusted under 35 U.S.C. 154(b) by 531 days.

(21) Appl. No.: 18/091,720

(22) Filed: Dec. 30, 2022

(65) Prior Publication Data

US 2024/0215239 A1     Jun. 27, 2024

(30) Foreign Application Priority Data

Dec. 26, 2022    (CN) .......................... 202211677044.9

(51) Int. Cl.
*H10B 43/27* (2023.01)
*H01L 25/16* (2023.01)
(Continued)

(52) U.S. Cl.
CPC ............. *H10B 43/27* (2023.02); *H01L 25/16* (2013.01); *H10B 41/27* (2023.02); *H10B 41/41* (2023.02);
(Continued)

(58) Field of Classification Search
CPC ........ H10B 43/27; H10B 41/27; H10B 41/41; H10B 43/40; H10B 43/50; H10B 80/00;
(Continued)

(56) References Cited

U.S. PATENT DOCUMENTS 9,659,956 B1 *  5/2017  Pachamuthu .......... H10B 41/41
10,867,678 B2   12/2020  Chen et al.
(Continued)

OTHER PUBLICATIONS

James et al., "Unlocking the Secrets of the YMTC 64-Layer 3D Xtacking NAND Flash," Semiconductor Digest, dated Sep. 8, 2020, 10 pages.

*Primary Examiner* — Eliseo Ramos Feliciano
*Assistant Examiner* — Brad A Knudson
(74) *Attorney, Agent, or Firm* — Hanley, Flight & Zimmerman, LLC

(57) ABSTRACT

A three-dimensional (3D) memory device includes a memory array device, a peripheral device, an etch stop layer, and a backside gate line slit. The memory array device includes a frontside and a backside, a plurality of memory strings, and a plurality of word lines in a staircase structure coupled to the plurality of memory strings. The peripheral device is above the frontside of the memory array device. The etch stop layer is between the memory array device and the peripheral device. The backside gate line slit extends through the backside of the memory array device to the etch stop layer. The backside gate line slit includes a conductive gate line layer and an insulating gate line layer. The 3D memory device can increase manufacturing efficiency, increase yield, reduce thermal stress, reduce fluorine contamination, increase an overlay window, and decrease overlay errors.

20 Claims, 29 Drawing Sheets

(51) Int. Cl.

| | | |
|---|---|---|
| *H10B 41/27* | (2023.01) | |
| *H10B 41/41* | (2023.01) | |
| *H10B 43/40* | (2023.01) | |
| *H10B 43/50* | (2023.01) | |
| *H10B 80/00* | (2023.01) | |

(52) U.S. Cl.
CPC ............. *H10B 43/40* (2023.02); *H10B 43/50* (2023.02); *H10B 80/00* (2023.02); *H01L 2224/83895* (2013.01); *H01L 2224/83896* (2013.01)

(58) Field of Classification Search
CPC ........... H01L 25/16; H01L 2224/83895; H01L 2224/83896
See application file for complete search history.

(56) References Cited

U.S. PATENT DOCUMENTS

| | | | |
|---|---|---|---|
| 2020/0243500 A1* | 7/2020 | Zhou ........................ | H01L 24/03 |
| 2020/0266207 A1 | 8/2020 | Liu | |
| 2021/0104472 A1* | 4/2021 | Shimamoto ............ | H10B 43/35 |
| 2021/0320119 A1* | 10/2021 | Zhang .................... | H10B 43/27 |
| 2023/0354603 A1* | 11/2023 | Choi ...................... | H10B 43/35 |

* cited by examiner

500C

500D

500K
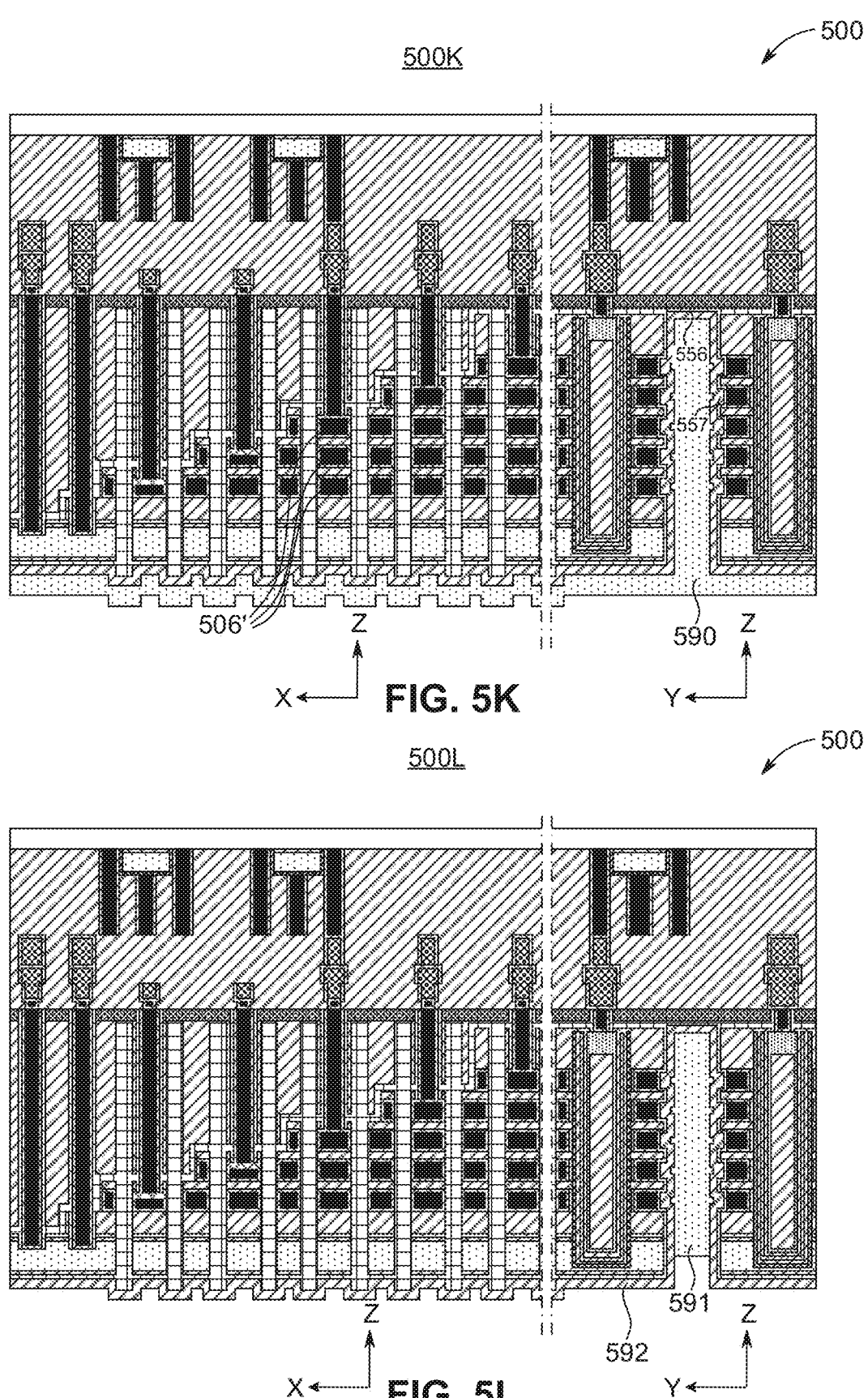
506'
590
556
557
X ← FIG. 5K    Y ←    500
500L
591
592
X ← FIG. 5L    Y ←

500
500M
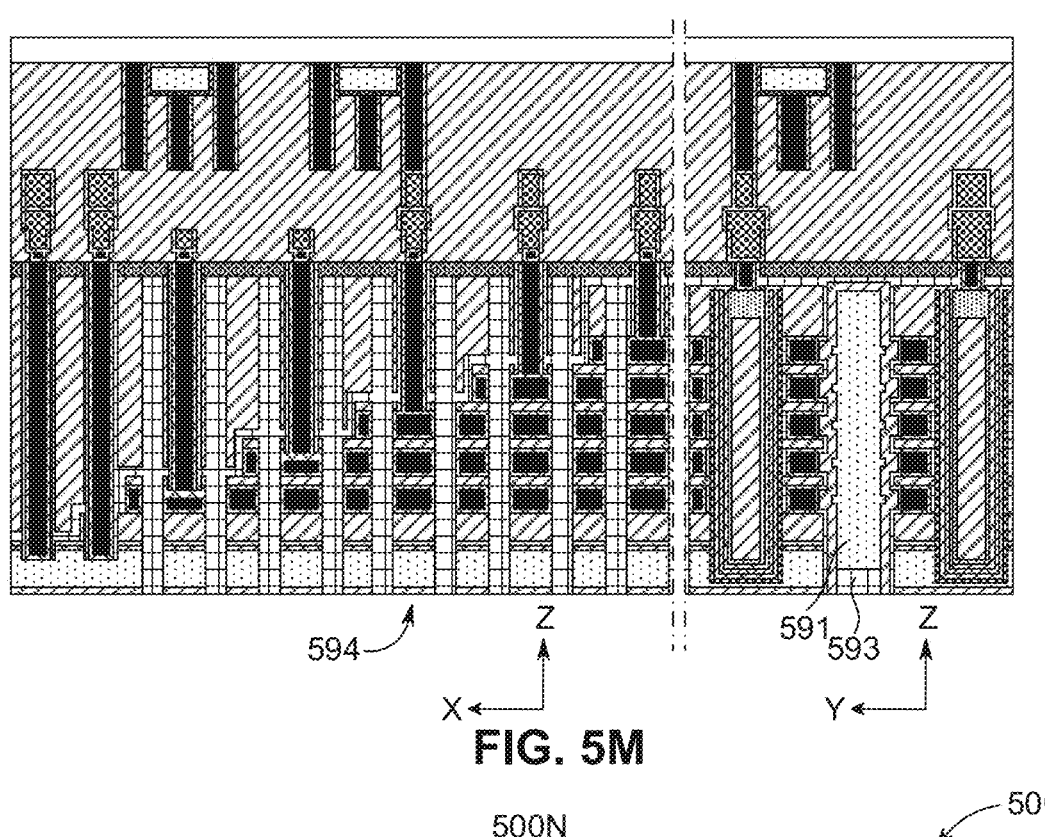
594     Z     591 593     Z
X     Y
FIG. 5M
500N
500
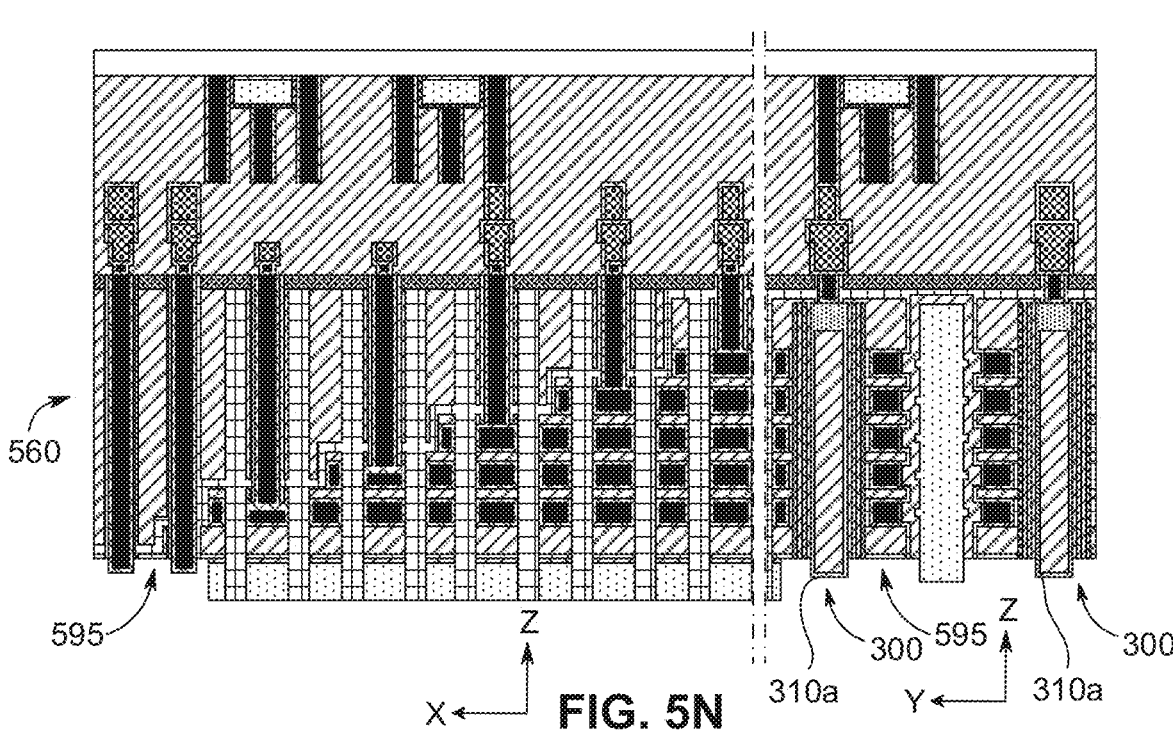
560
595     Z     300 595 Z 300
310a     Y 310a
X    ## FIG. 5N

700E

500'

541

558

Z

Z

X

Y

700F

500'

542

558

Z

Z

X

Y

700K

500'

561a    558
580
560'
557
556
555

506"        Z
561b    590        Z

X        Y

700L

500'

558

Z        Z
592    591

X        Y

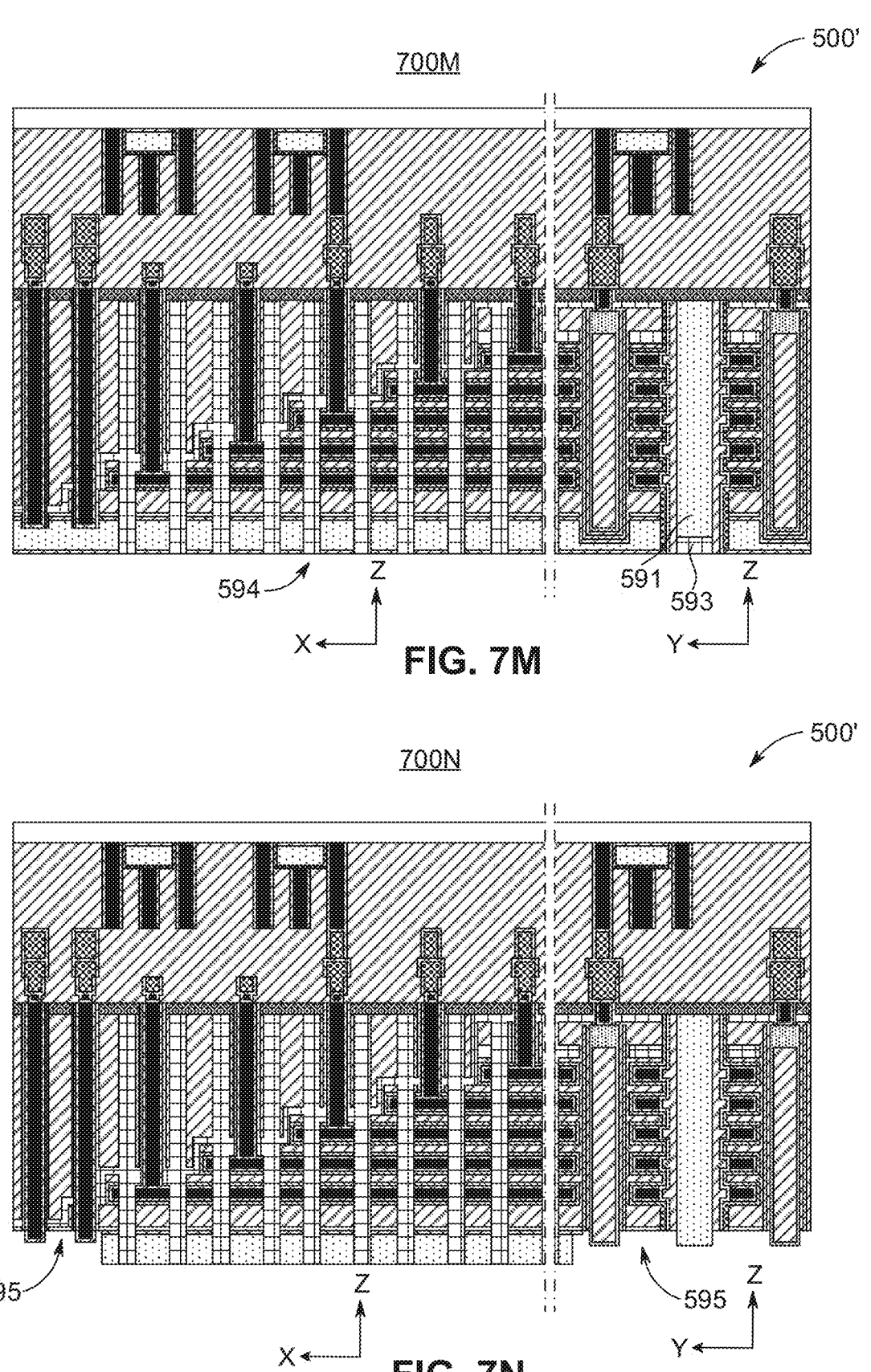
700M
500'
594          Z
X          FIG. 7M          Y
591          Z
593
700N
500'
595          Z          595
X          FIG. 7N          Y

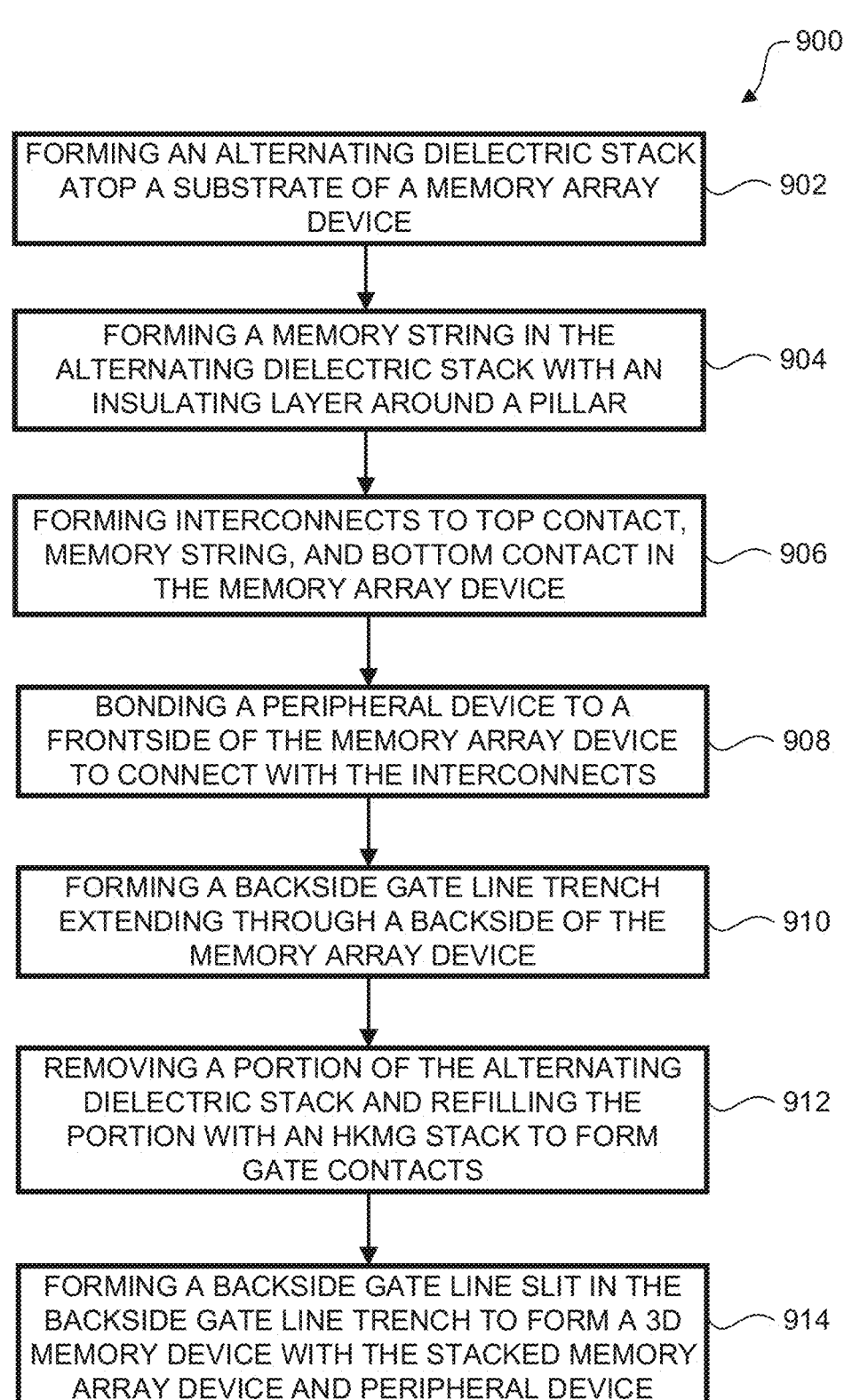

900

FORMING AN ALTERNATING DIELECTRIC STACK ATOP A SUBSTRATE OF A MEMORY ARRAY DEVICE — 902

FORMING A MEMORY STRING IN THE ALTERNATING DIELECTRIC STACK WITH AN INSULATING LAYER AROUND A PILLAR — 904

FORMING INTERCONNECTS TO TOP CONTACT, MEMORY STRING, AND BOTTOM CONTACT IN THE MEMORY ARRAY DEVICE — 906

BONDING A PERIPHERAL DEVICE TO A FRONTSIDE OF THE MEMORY ARRAY DEVICE TO CONNECT WITH THE INTERCONNECTS — 908

FORMING A BACKSIDE GATE LINE TRENCH EXTENDING THROUGH A BACKSIDE OF THE MEMORY ARRAY DEVICE — 910

REMOVING A PORTION OF THE ALTERNATING DIELECTRIC STACK AND REFILLING THE PORTION WITH AN HKMG STACK TO FORM GATE CONTACTS — 912

FORMING A BACKSIDE GATE LINE SLIT IN THE BACKSIDE GATE LINE TRENCH TO FORM A 3D MEMORY DEVICE WITH THE STACKED MEMORY ARRAY DEVICE AND PERIPHERAL DEVICE — 914

FIG. 9

BACKSIDE GATE LINE SLIT STRUCTURE TO REDUCE WAFER BOW IN A THREE-DIMENSIONAL MEMORY DEVICE COMPRISING BONDED DEVICES

BACKGROUND

Field

The present disclosure relates to three-dimensional (3D) memory device apparatuses, systems, and methods, for example, 3D memory device apparatuses, systems, and methods having a backside gate line slit to reduce wafer bow.

Background

Planar memory cells can be scaled to smaller sizes by improving process technologies, circuit designs, programming algorithms, and fabrication processes. But as feature sizes of memory cells approach a lower limit, planar processes and fabrication methods become more difficult, inefficient, and costly. As a result, memory density for planar memory cells approaches an upper limit. The memory density limitation in planar memory cells can be addressed by 3D memory architectures, for example, a 3D NAND memory device. 3D memory architectures can include a memory array and peripheral devices, for example, to control signals to and from the memory array.

However, as the number of 3D memory layers increases (e.g., vertically), wafer bow can increase, thermal stress and contamination in the 3D memory device can increase, and overlay and bonding misalignments can increase.

SUMMARY

Accordingly, there is a need to, e.g., provide a 3D memory device having a backside gate line slit. Further, there is a need to decrease wafer bow and bonding misalignment. Further, there is a need to decrease thermal stress, fluorine contamination, and overlay misalignment. Further, there is a need to increase an overlay window and decrease an overall die size. Further, there is a need to increase manufacturing efficiency, yield, and/or scalability.

In some aspects, a 3D memory device can include a memory array device, an etch stop layer, a peripheral device, and a backside gate line slit. In some aspects, the memory array device can have a frontside and a backside. In some aspects, the memory array device can include a plurality of memory strings coupled to a plurality of word lines in a staircase structure. In some aspects, the etch stop layer can be disposed on the frontside of the memory array device. In some aspects, the peripheral device can be disposed on the etch stop layer, the etch stop layer being between the memory array device and the peripheral device. In some aspects, the backside gate line slit can extend through the backside of the memory array device to the etch stop layer. In some aspects, the backside gate line slit can include a conductive gate line layer and an insulating gate line layer.

In some aspects, the insulating gate line layer is between the etch stop layer and the conductive gate line layer.

In some aspects, the 3D memory device can further includes an array common source coupled to the plurality of memory strings and the backside gate line slit. In some aspects, the insulating gate line layer is between the conductive gate line layer and the array common source.

In some aspects, the insulating gate line layer can include a high-k dielectric layer.

In some aspects, the plurality of word lines each can include a word line insulating layer. In some aspects, the word line insulating layer can include a high-k dielectric layer.

In some aspects, the plurality of memory strings each can include a pillar and an insulating layer surrounding the pillar. In some aspects, the insulating layer can include a high-k dielectric layer.

In some aspects, the 3D memory device can further include a pad-out interconnection layer coupled to the backside of the memory array device.

In some aspects, the etch stop layer can have a thickness in a range of about 5 nm to about 50 nm.

In some aspects, a cross-sectional diameter of the backside gate line slit decreases from the backside of the memory array device towards the frontside of the memory array device, and a cross-sectional diameter of each of the plurality of memory strings increases from the backside of the memory array device towards the frontside of the memory array device.

In some aspects, a method for forming a 3D memory device can include the steps of: (a) forming a plurality of memory strings through a dielectric stack; (b) forming a staircase structure in the dielectric stack to form a memory array device having a frontside and a backside; (c) forming an etch stop layer on the frontside of the memory array device; (d) forming a plurality of interconnections through the etch stop layer to the plurality of memory strings and the staircase structure of the memory array device; (e) bonding a peripheral device above the memory array device to the plurality of interconnections; and (f) forming a backside gate line slit extending through the backside of the memory array device to the etch stop layer, the backside gate line slit including a conductive gate line layer and an insulating gate line layer.

In some aspects, forming the backside gate line slit can include forming the insulating gate line layer between the etch stop layer and the conductive gate line layer.

In some aspects, the method can further include forming an array common source coupled to the plurality of memory strings and the backside gate line slit. In some aspects, forming the backside gate line slit can include forming the insulating gate line layer between the conductive gate line layer and the array common source.

In some aspects, forming the backside gate line slit can include forming the insulating gate line layer with a high-k dielectric layer.

In some aspects, forming the backside gate line slit can include forming a plurality of word lines in the staircase structure, the plurality of word lines coupled to the plurality of interconnections. In some aspects, forming the plurality of word lines can include forming a word line insulating layer including a high-k dielectric layer.

In some aspects, forming the plurality of memory strings can include forming a pillar and an insulating layer surrounding the pillar. In some aspects, the insulating layer can include a high-k dielectric layer.

In some aspects, the method can further include forming a pad-out interconnection layer coupled to the backside of the memory array device.

In some aspects, forming the backside gate line slit can include etching a backside gate line trench through the backside of the memory array device to the etch stop layer.

In some aspects, forming the plurality of memory strings can include forming each memory string with a larger cross-sectional diameter at the frontside of the memory array device than a cross-sectional diameter at the backside of the memory array device.

In some aspects, forming the backside gate line slit can include forming the conductive gate line layer on the etch stop layer. In some aspects, forming the insulating gate line layer can include forming a high-k dielectric layer.

In some aspects, forming the backside gate line slit can include forming the backside gate line slit with a smaller cross-sectional diameter at the frontside of the memory array device than a cross-sectional diameter at a backside of the memory array device.

Implementations of any of the techniques described above may include a system, a method, a process, a device, and/or an apparatus. The details of one or more implementations are set forth in the accompanying drawings and the description below. Other features will be apparent from the description and drawings, and from the claims.

Further features and exemplary aspects of the aspects, as well as the structure and operation of various aspects, are described in detail below with reference to the accompanying drawings. It is noted that the aspects are not limited to the specific aspects described herein. Such aspects are presented herein for illustrative purposes only. Additional aspects will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the aspects and, together with the description, further serve to explain the principles of the aspects and to enable a person skilled in the relevant art(s) to make and use the aspects.

FIG. 9 illustrates a flow diagram for forming the 3D memory device shown in FIG. 6, according to an exemplary aspect.

Figure 1:
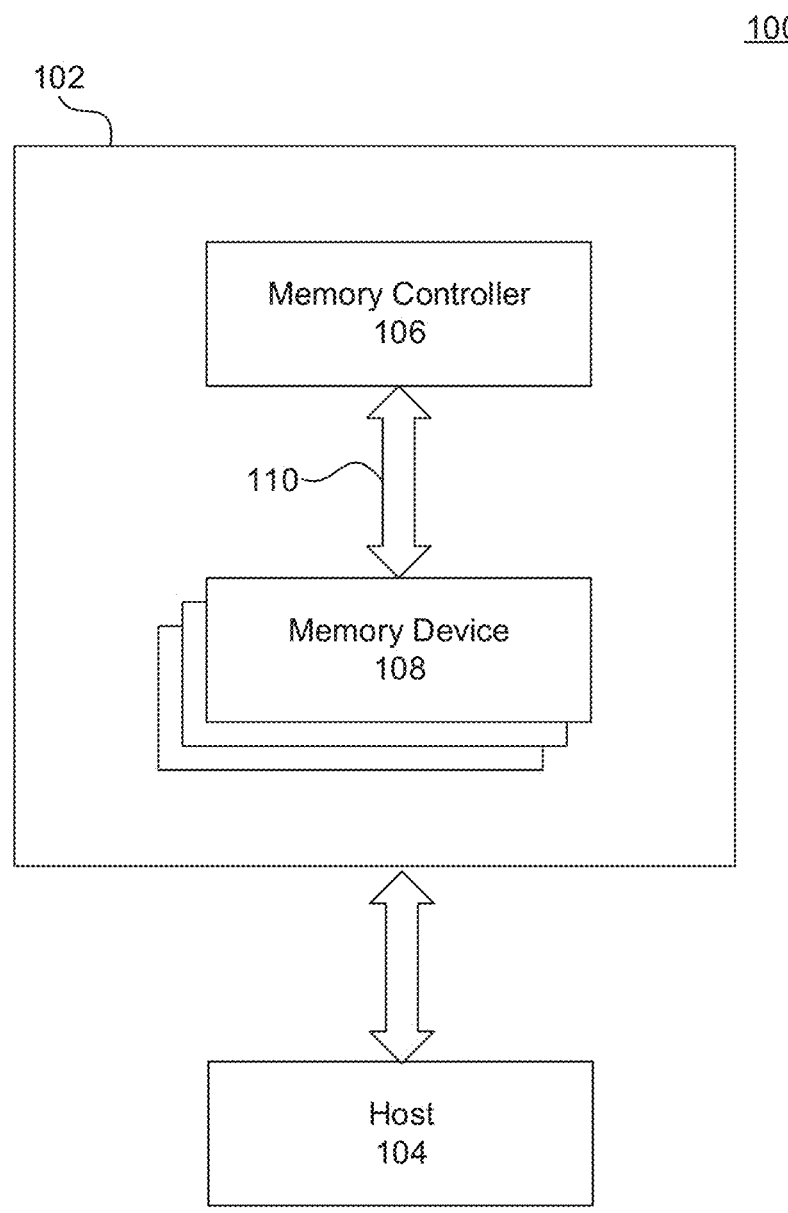
FIG. 1 is a schematic illustration of a memory system with a memory controller and a memory device, according to an exemplary aspect.

The features and exemplary aspects of the aspects will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more aspects that incorporate the features of this present invention. The disclosed aspect(s) merely exemplify the present invention. The scope of the invention is not limited to the disclosed aspect(s). The present invention is defined by the claims appended hereto.

The aspect(s) described, and references in the specification to "one aspect," "an aspect," "an example aspect," "an exemplary aspect," etc., indicate that the aspect(s) described may include a particular feature, structure, or characteristic, but every aspect may not necessarily include the particular feature, structure, or characteristic. Moreover, such phrases are not necessarily referring to the same aspect. Further, when a particular feature, structure, or characteristic is described in connection with an aspect, it is understood that it is within the knowledge of one skilled in the art to effect such feature, structure, or characteristic in connection with other aspects whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" or "substantially" or "approximately" as used herein indicates the value of a given quantity that can vary based on a particular technology. Based on the particular technology, the term "about" or "substantially" or "approximately" can indicate a value of a given quantity that varies within, for example, 1-15% of the value (e.g., ±1%, ±2%, ±5%, ±10%, or 15% of the value).

The term "gate line trench" as used herein indicates a trench or hole extending through an alternating dielectric stack of a memory device. The gate line trench can be used to form a gate line slit in the memory device.

The term "gate line slit" or "GLS" as used herein indicates a conductive or non-conductive (e.g., dielectric) pathway through an alternating dielectric stack, for example, between adjacent memory blocks or adjacent memory fingers. In some aspects, the GLS can provide connection to a memory cell in a memory device. In some aspects, the GLS can be used as an array common source (ACS) of multiple storage memory strings. The GLS can extend vertically through the stack and extend horizontally between two adjacent arrays of memory blocks or memory fingers.

The term "hybrid wafer bonding" or "Xtacking" as used herein indicates a bonding technique to integrate two wafers or dies into a 3D memory device, for example, one for a memory array device (e.g., NAND die) and another for a peripheral device (e.g., CMOS wafer/die). Xtacking can bond peripheral circuitry of the peripheral device face-to-face to the memory array device with a material layer (e.g., etch stop layer) between the memory array device and the peripheral device. Xtacking can increase memory density of the memory array device and provide increased input-output (I/O), for example, 7500 MB/s read rate and 5500 MB/s write rate. In some aspects, the dies can have a four-plane design. In some aspects, the peripheral device can include peripheral circuitry to control operations of the memory array device (e.g., page buffers, column decoders, charge pumps, global data path, voltage generators, voltage selectors, etc.).

Before describing aspects of the disclosure in more detail, however, it is instructive to present example environments in which aspects of the present disclosure may be implemented.

Exemplary Memory System

Figure 2:
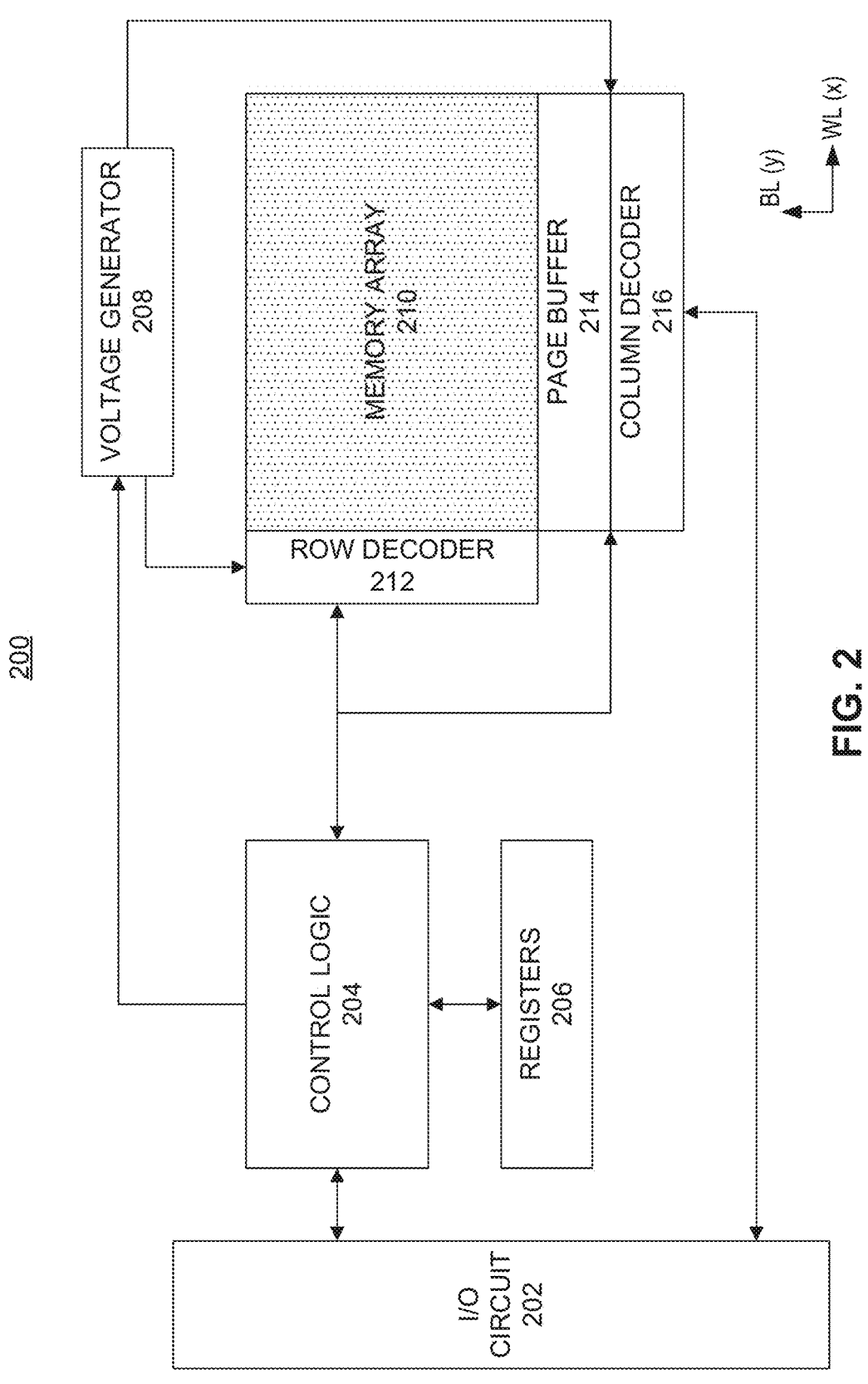
FIG. 2 is a schematic block diagram of a memory device shown in FIG. 1, according to an exemplary aspect.
Figure 3:
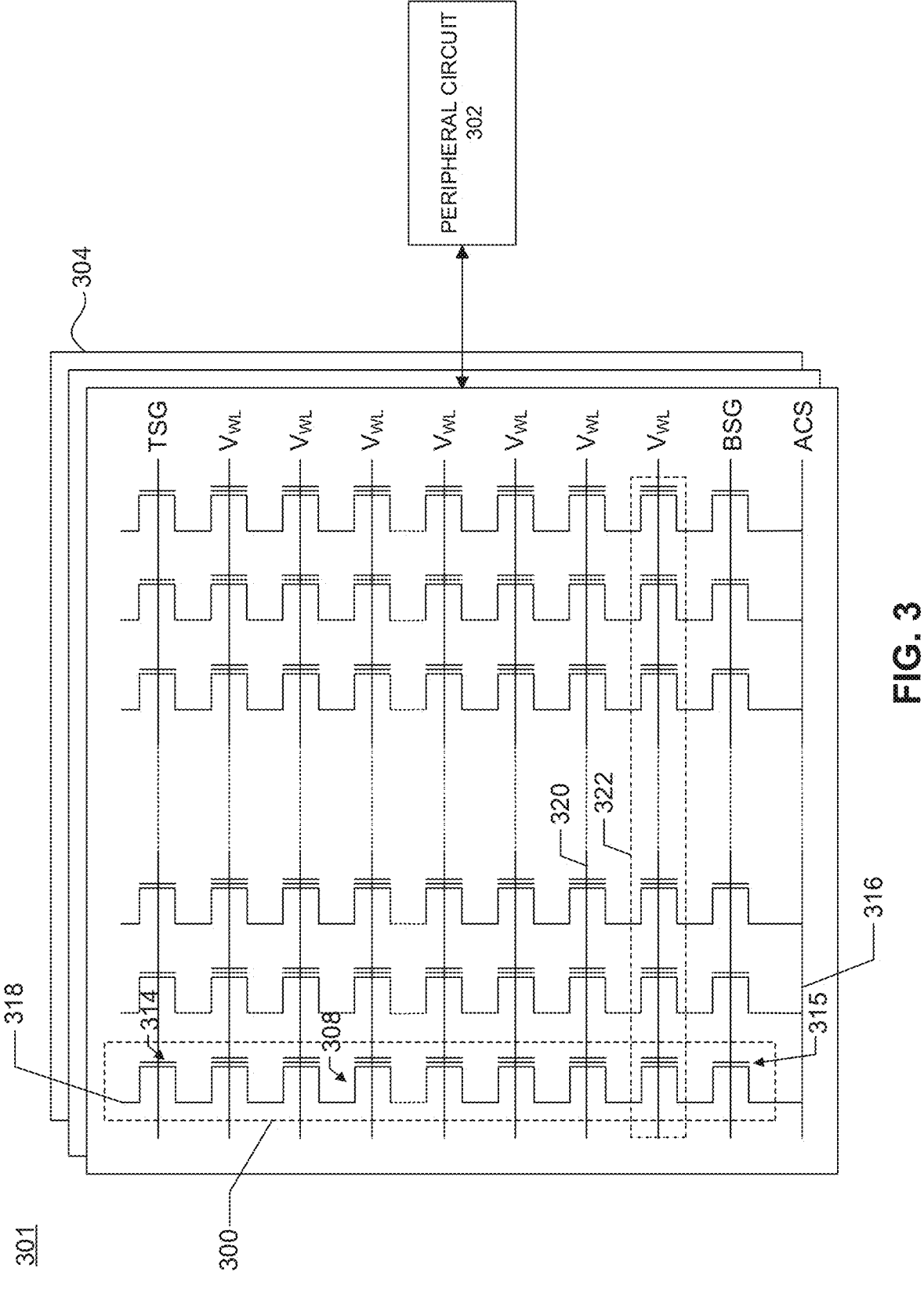
FIG. 3 is a schematic circuit diagram of a memory array of the memory device shown in FIG. 2, according to an exemplary aspect.

FIGS. 1-3 illustrate memory system 100 with memory controller 106 and memory device 108, according to various exemplary aspects. Although memory system 100 is shown in FIGS. 1-3 as a stand-alone apparatus and/or system, the aspects of this disclosure can be used with other apparatuses, systems, and/or methods, such as, but not limited to, memory apparatus 102, memory controller 106, memory device 108, 3D memory device 400, 3D memory device 400', manufacturing method 500, manufacturing method 500', flow diagram 800, and/or flow diagram 900.

As shown in FIG. 1, memory system 100 can include, but is not limited to, wireless communication devices, smartphones, laptops, desktops, tablets, personal assistant devices, monitors, televisions, wearable devices, Internet of Things (IoT) devices, vehicle communication devices, and the like. Memory system 100 can include a memory apparatus 102 and a host 104. In some aspects, memory apparatus 102 can also be referred to as a solid state drive (SSD), which can include one or more memory devices 108 and memory controller 106. The one or more memory devices 108 can communicate with the host 104 through the memory controller 106, where the memory controller 106 can be connected to the memory device 108 via a memory channel 110. In some aspects, the memory apparatus 102 can have more than one memory device 108, while each memory device 108 can be managed by the memory controller 106. In some aspects, the memory controller 106 can include one or more processors.

Host 104 sends data to be stored at the memory apparatus 102 or retrieves data by reading the memory apparatus 102. Memory controller 106 can handle I/O requests received from the host 104, ensure data integrity and efficient storage, and manage the memory device 108. The memory channel 110 can provide data and control communications between the memory controller 106 and the one or more memory devices 108 via a data bus.

The memory device 108 (e.g., "flash," "NAND flash," "NAND") can be a memory chip (package), a memory die, or any portion of a memory die, and can include one or more memory planes, each of which can include a plurality of memory blocks. Identical and concurrent operations can take place at each memory plane. The memory block, which can be megabytes (MB) in size, is the smallest size to carry out erase operations. In some aspects, the memory device 108 can include four memory planes and each memory plane can include six memory blocks. Each memory block can include a plurality of memory cells, where each memory cell can be addressed through interconnections such as bit lines (BL) and word lines (WL). The bit lines (BL) and word lines (WL) can be laid out perpendicularly (e.g., in rows and columns, respectively), forming an array of metal lines. In this disclosure, the memory block is also referred to as the "memory array" or "array." The memory array is the core area in a memory device, performing storage functions.

FIG. 2 illustrates a schematic block diagram of memory device 200, according to an exemplary aspect. In some aspects, memory device 200 can be an example of memory device 108 shown in FIG. 1. As shown in FIG. 2, memory device 200 can include digital, analog, and/or mixed-signal circuits to support functions of a memory array 210, for example, row decoders 212, page buffers 214, and column decoders 216. Memory device 200 can also include I/O circuit 202, a control logic 204, a register 206, and a voltage generator 208. Control logic 204 can be configured to control other components of the memory device 200. For example, control logic 204 can control voltage generator 208, which generates voltages to be applied to memory cells of memory array 210. Registers 206 can be coupled to control logic 204 and include registration information, such as address information. In some aspects, memory device 200 can communicate with a controller, such as memory controller 106 shown in FIG. 1 via the I/O circuit 202. For example, memory device 200 can receive commands from the controller via the I/O circuit 202 and/or transmit data retrieved from the memory array 210 to the controller.

It is noted that the layout of the electronic components in memory apparatus 102 of FIG. 1 and memory device 200 of FIG. 2 are shown as an example. The memory apparatus 102 and the memory device 200 can have other layouts and can include additional components.

FIG. 3 illustrates a schematic circuit diagram 301 of a memory device, according to an exemplary aspect. The example schematic circuit diagram 301 includes a memory cell array 304 and a peripheral circuit 302. In some aspects, the example schematic circuit diagram 301 can include a plurality of memory strings 300, each memory string 300 having a plurality of memory cells 308. The memory string 300 also includes at least one transistor (e.g., a MOSFET) at each end, which is controlled by a top select gate (TSG) 314 and a bottom select gate (BSG) 315, respectively. The memory cell 308 can be controlled by a control gate, where the control gate can be connected to a word line (WL) 320 of the example schematic circuit diagram 301. The drain terminal of the TSG 314 can be connected to the bit line (BL) 318, and the source terminal of the BSG 315 can be connected to an array common source (ACS) 316. The ACS 316 can be shared by the memory strings 300 in an entire memory block, and is also referred to as the common source line.

In some aspects, the example schematic circuit diagram 301 can be formed based on charge trapping technology. In some aspects, the example schematic circuit diagram 300 can be formed based on the floating gate technology. NAND flash memory based on charge trapping can provide high storage density and high intrinsic reliability. Storage data or logic states (e.g., threshold voltage $V_{th}$ of the memory cell 308) depends on the amount of charge trapped in a storage layer. In some aspects, the memory array 210 can be a three-dimensional (3D) memory device, and the example schematic circuit diagram 301 can be a 3D memory array, where the memory cells 308 can be vertically stacked on top of each other.

In a NAND flash memory, read and write operations can be performed in a memory page 322, which includes all memory cells 308 sharing the same word line (WL). In a NAND memory, the memory cell 308 can be in an erase state (ER) or a programmed state (PN). Initially, all memory cells 308 in the example schematic circuit diagram 301 can be reset to the erase state as logic "1" by implementing a negative voltage difference between control gates and source terminals of the memory cells (e.g., the array common source 316) such that all the trapped electronic charges in the storage layer of the memory cells 308 can be removed. For example, the negative voltage difference can be induced by setting the control gates of the memory cells 308 to ground, and applying a high positive voltage to the array common source 316. At the erase state (ER), the threshold voltage $V_{th}$ of the memory cells 308 can be reset to the lowest value, and can be measured or sensed at the bit line (BL) 318.

During programming (i.e., writing), a programming voltage $V_{pgm}$ (e.g., a positive voltage pulse between 10 V and 20 V) can be applied on the control gate such that electronic charges (e.g., electrons) can be injected into the storage layer of the memory cell 308, and thereby increase the threshold voltage $V_{th}$ of the memory cell 308. Thus, the memory cell 308 is programmed to a programmed state (e.g., P1).

A NAND flash memory can be configured to operate in a single-level cell (SLC) mode. To increase storage capacity, a NAND flash memory can also be configured to operate in a multi-level cell (MLC) mode, a triple-level cell (TLC) mode, a quad-level cell (QLC) mode, or a combination of any of these modes. In the SLC mode, a memory cell stores "1" bit and has two logic states ("states"), e.g., states ER and P1. In the MLC mode, a memory cell stores 2 bits, and has four states, e.g., states ER, P1, P2, and P3. In the TLC mode, a memory cell stores 3 bits, and has eight states, e.g., states ER and P1-P7. In the QLC mode, a memory cell stores 4 bits and has sixteen states, e.g., states ER and P1-P15.

Figures 10, 11:
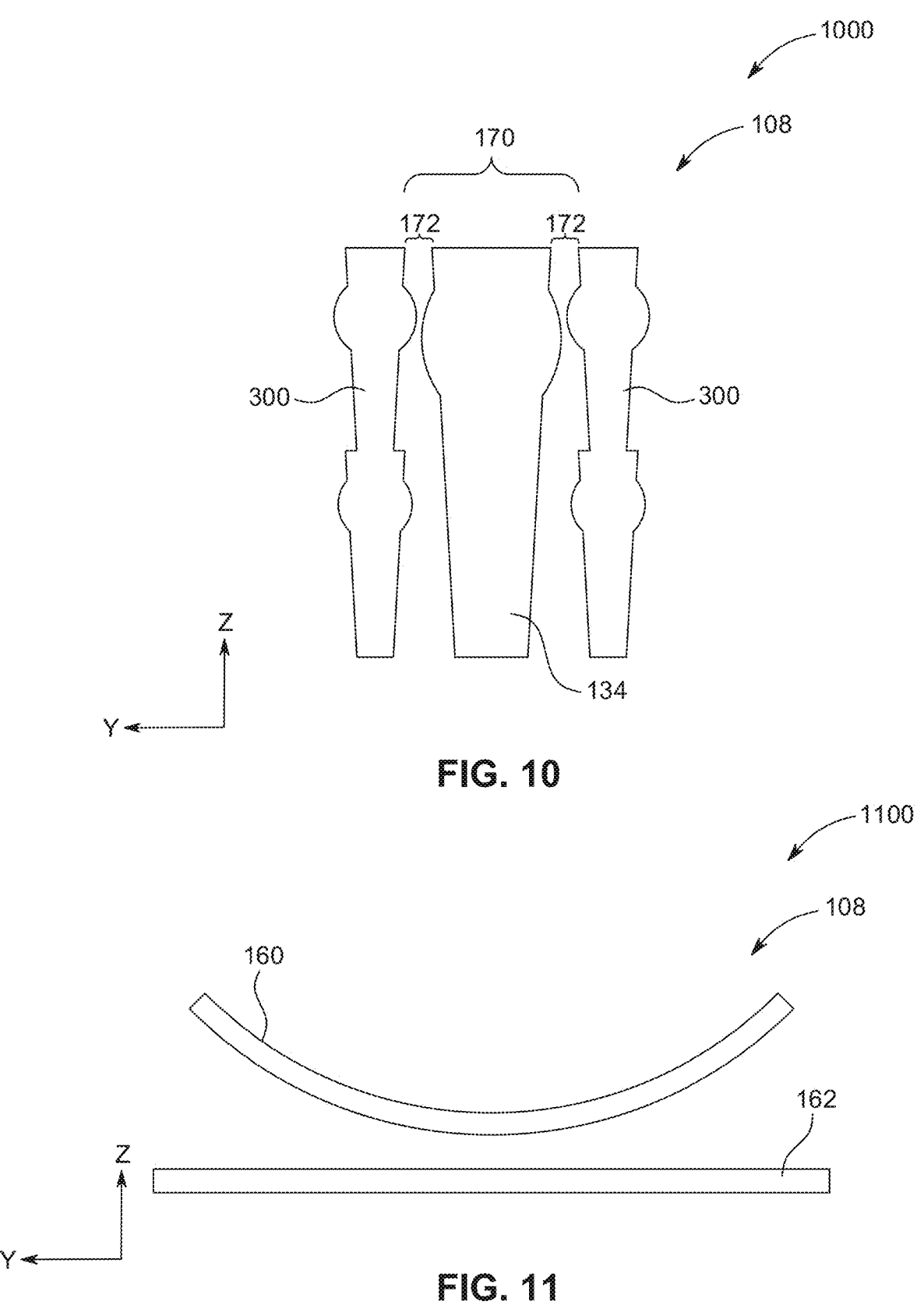
FIG. 10 is a schematic partial cross-sectional illustration of a 3D memory device, according to an exemplary aspect.
FIG. 11 is a schematic partial cross-sectional illustration of a 3D memory device, according to an exemplary aspect.

In some aspects, memory device 108 can include a 3D memory device (e.g., 3D NAND memory device). For example, memory device 108 can include a memory array device 160 and a peripheral device 162 coupled to (e.g., bonded to) the memory array device 160. In some aspects, memory device 108 can include wafer bow between memory array device 160 and peripheral device 162, for example, due to thermal processing (e.g., thermal stress) during or after bonding memory array device 160 and peripheral device 162. For example, as shown in FIG. 11, memory array device 160 can have wafer bow (e.g., non-planar surface) relative to peripheral device 162, thereby increasing bonding and overlay misalignment.

In some aspects, memory device 108 can include a plurality of memory strings 300 and adjacent memory strings 300 can be separated by a gate line slit (GLS) 134 (e.g., along the Y-direction). In some aspects, memory device 108 (e.g., memory array device 160) can include overlay window 170 between adjacent memory strings 300 and GLS 134. For example, as shown in FIG. 10, overlay window 170 can include overlay step area 172 between GLS 134 and adjacent memory strings 300. In some aspects, GLS 134 and memory strings 300 can be fabricated on the same side of memory array device 160, for example, a frontside, thereby decreasing overlay step area 172 (e.g., decreasing available patterning area) and increasing overlay misalignment (e.g., between GLS 134 and memory strings 300, etc.).
Exemplary 3D Memory Devices As discussed above, as the number of 3D memory vertical layers increases, wafer bow can increase, thermal stress and contamination in the 3D memory device can increase, and overlay and bonding misalignments can increase. Wafer bow occurs due to thermal stress and strain in the 3D memory device, for example, after bonding the peripheral device to the memory array at high temperature. Wafer bow and warp (e.g., non-planar wafer) between the memory array and peripheral devices can cause bonding misalignment and increase manufacturing times. Subsequent thermal processing can be used to balance (e.g., relax) the thermal stress, but this can introduce contamination (e.g., fluorine) into the 3D memory device. Contamination can increase leakage current between memory cells and word lines as well as between adjacent word lines.

Further, increasing the number of vertical layers can increase a length (Z-direction) of a gate line slit and decrease a bottom-top critical dimension ratio of the gate line slit (e.g., deviating from a ratio of about 1), making it more difficult to control overlay patterning between the gate line slit and memory cells. In addition, reducing the critical dimension of the gate line slit becomes more difficult as the number of vertical layers increases. By patterning both the memory strings and gate line slit on the same wafer side (e.g., the frontside), the overlay window between the memory strings and the gate line slit (along the Y-direction) is small and can cause overlay misalignment, for example, as shown in FIG. 10. The overlay window can be increased, but this requires also increasing the overall die size. Moreover, increasing the overlay step area can cause an overlay shift that requires repeated mask realignment and increases manufacturing times, for example, when patterning interconnects in the memory array.

Aspects of 3D memory device apparatuses, systems, and methods as discussed below can provide a 3D memory device having a backside gate line slit to decrease wafer bow, decrease bonding misalignment, decrease thermal stress, decrease fluorine contamination, decrease overlay misalignment, increase an overlay window, decrease an overall die size, increase manufacturing efficiency, increase yield, and/or increase scalability by patterning the gate line slit on the backside of a memory array device (e.g., opposite an etch stop layer) of the 3D memory device after bonding a peripheral device to the memory array device, rather than on the frontside (e.g., adjacent the etch stop layer) of the memory array device prior to bonding the peripheral device.

Figures 4, 4A:
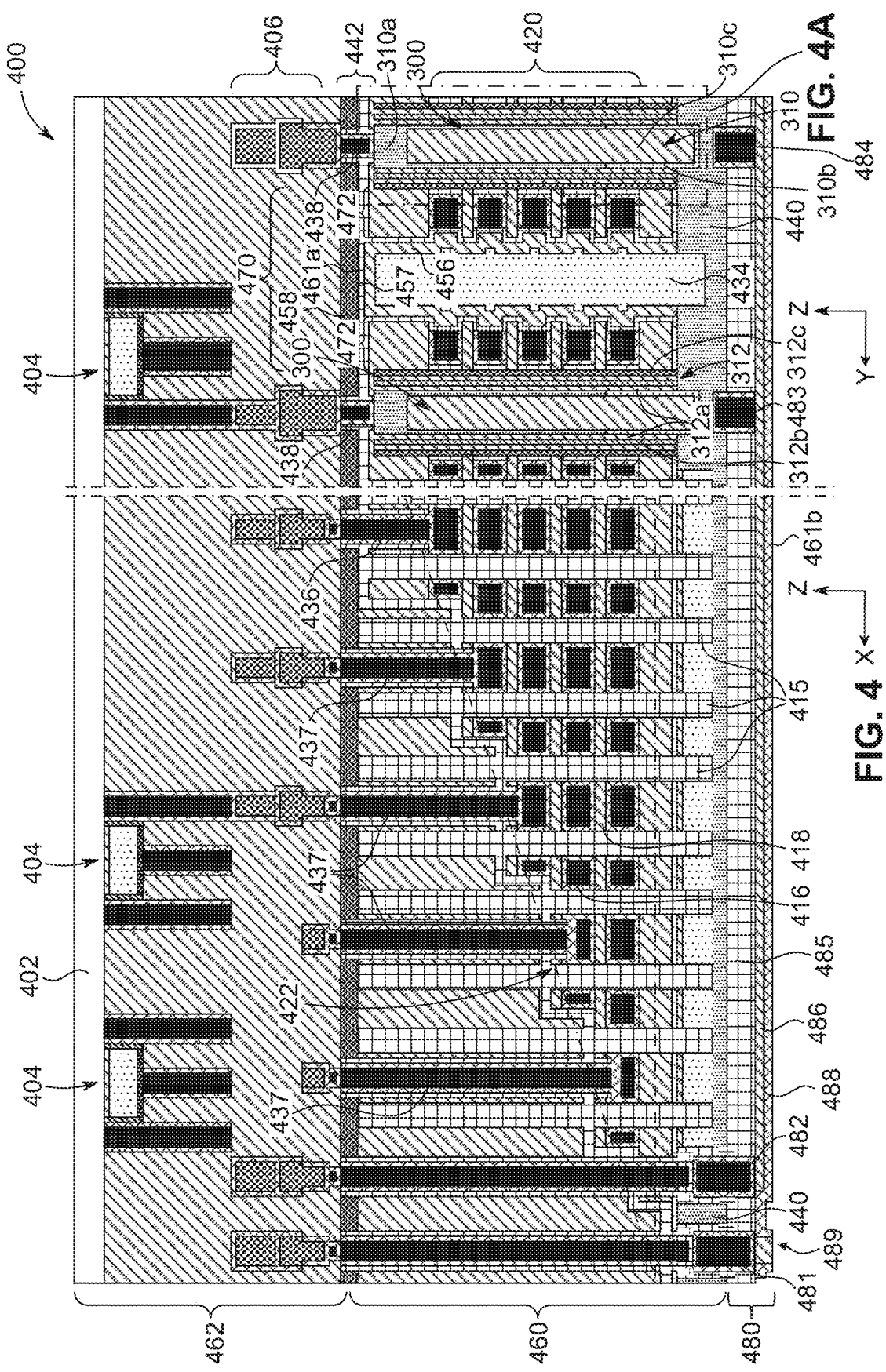
FIG. 4 is a schematic cross-sectional illustration of a 3D memory device, according to an exemplary aspect.
FIG. 4A is a schematic magnified cross-sectional illustration of a memory string of the 3D memory device shown in FIG. 4.
Figure 4A:
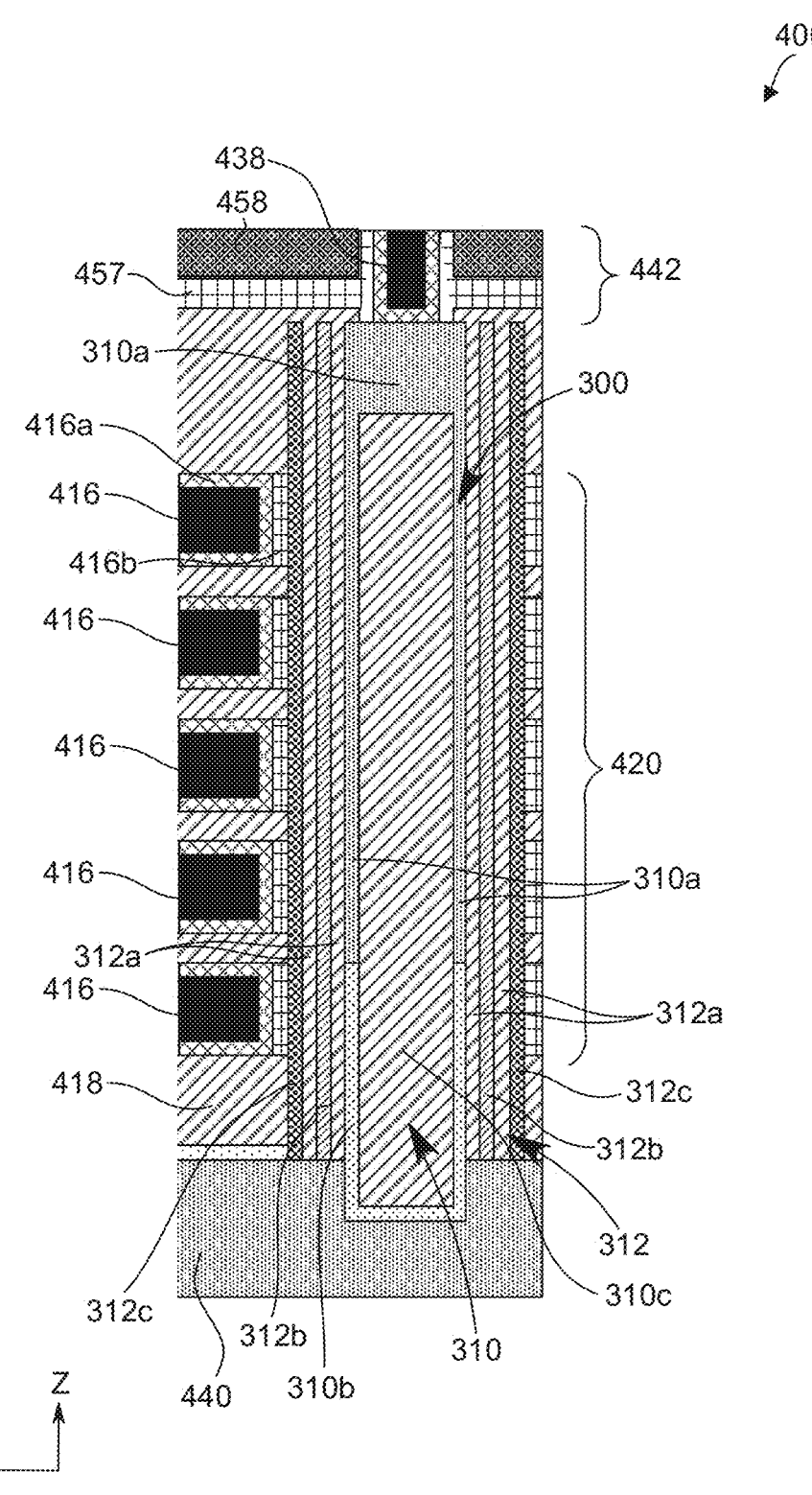

FIG. 4 illustrates 3D memory device 400, according to exemplary aspects. FIG. 4 is a schematic cross-sectional illustration of 3D memory device 400 with memory string 300 and backside GLS 434, according to an exemplary aspect. FIG. 4A is a schematic magnified cross-sectional illustration of memory string 300 of 3D memory device 400 shown in FIG. 4. 3D memory device 400 can be configured to decrease wafer bow and bonding misalignment by utilizing backside GLS 434 rather than a frontside GLS. 3D memory device 400 can be further configured to decrease thermal stress, fluorine contamination, and overlay misalignment by utilizing backside GLS 434 rather than a frontside GLS. 3D memory device 400 can be further configured to increase an overlay window and decrease an overall die size. 3D memory device 400 can be further configured to increase manufacturing efficiency, yield, and scalability. Although 3D memory device 400 is shown in FIG. 4 as a stand-alone apparatus and/or system, the aspects of this disclosure can be used with other apparatuses, systems, and/or methods, such as, but not limited to, memory system 100, memory device 108, memory string 300, 3D memory device 400', manufacturing method 500, manufacturing method 500', flow diagram 800, and/or flow diagram 900.

In some aspects, memory string 300 of 3D memory device 400 can include memory strings 300 of memory device 108 shown in FIGS. 1-3. The aspects of memory system 100 shown in FIGS. 1-3, for example, and the aspects of 3D memory device 400 shown in FIG. 4 may be similar. Similar reference numbers are used to indicate features of the aspects of memory system 100 shown in FIGS. 1-3 and the similar features of the aspects of 3D memory device 400 shown in FIG. 4.

As shown in FIG. 4, 3D memory device 400 can include memory array device 460, peripheral device 462, and pad-out interconnection layer 480. Peripheral device 462 can be bonded to memory array device 460 along a bonding layer, for example, etch stop layer 458. In some aspects, as shown in FIG. 4, peripheral device 462 can be bonded to frontside 461a of memory array device 460.

Peripheral device 462 can be configured to control operations of 3D memory device 400. Peripheral device 462 can be further configured to interconnect (e.g., face-to-face) with memory array device 460. Peripheral device 462 can include substrate 402, plurality of transistors 404, and interconnect layer 406. In some aspects, plurality of transistors 404 can be configured to provide logic and/or control signals to memory array device 460. In some aspects, as shown in FIG. 4, interconnect layer 406 can be coupled (e.g., connected) to array interconnect layer 442 of memory array device 460. In some aspects, peripheral device 462 can include a complementary metal-oxide-semiconductor (CMOS) device. For example, plurality of transistors 404 can be fabricated from substrate 402 with CMOS processing. In some aspects, peripheral device 462 can include a back-end-of-line (BEOL) interconnect layer.

Pad-out interconnection layer 480 can be configured to provide connections to memory array device 460. Pad-out interconnection layer 480 can be further configured to provide an array common source (ACS) connection to each memory string 300 via source line (SL) contacts 440. Pad-out interconnection layer 480 can include pad interconnect 481, ACS interconnects 482, 483, 484, isolating layer 485, ACS connection layer 486, protective layer 488, and contact pad 489. Isolating layer 485 can be a dielectric (e.g., oxide, nitride, etc.) and electrically isolate ACS interconnect 482 from SL contacts 440. ACS connection layer 486 can be a conductor (e.g., Al, W, Co, polysilicon, etc.) and connect ACS interconnects 482, 483, 484. Protective layer 488 can be a dielectric (e.g., oxide, nitride, etc.) and electrically isolate ACS interconnects 482, 483, 484 from pad interconnect 481 coupled to contact pad 489.

Etch stop layer 458 can be configured to promote bonding between memory array device 460 and peripheral device 462. Etch stop layer 458 can be further configured to form interconnects (e.g., array interconnect layer 442) in memory array device 460. Etch stop layer 458 can be further configured to act as a backside etch stop during fabrication of backside GLS 434. As shown in FIG. 4, etch stop layer 458 can be between memory array device 460 and peripheral device 462. In some aspects, etch stop layer 458 can include a dielectric, for example, oxide, nitride, silicon nitride (SiN), oxynitride, oxide-nitride-oxide (ONO), or high-k dielectric. In some aspects, etch stop layer 458 can include polysilicon or highly doped silicon. In some aspects, etch stop layer 458 can include a metal (e.g., Al, W, Co, Cu, etc.). In some aspects, etch stop layer 458 can have a thickness of about 1 nm to about 50 nm. For example, etch stop layer 458 can have a thickness of about 5 nm to about 20 nm.

In some aspects, etch stop layer 458 can promote hybrid wafer bonding (e.g., Xtacking) between memory array device 460 and peripheral device 462. In some aspects, peripheral device 462 and memory array device 460 can be bonded using hybrid bonding (e.g., "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some aspects, the metal-metal bonding can be formed between interconnect layer 406 of peripheral device 462 and array interconnect layer 442 of memory array device 460, and the dielectric-dielectric bonding can be formed between the dielectric materials (e.g., oxides) at the remaining areas of etch stop layer 458. In some aspects, the hybrid bonding can include Xtacking.

Memory array device 460 can be configured as an addressable memory array having a plurality of memory strings (e.g., memory strings 300 each with a plurality of memory cells 260 as shown in FIG. 3). Memory array device 460 can include frontside 461a, backside 461b, memory stack 420, memory string 300, backside GLS 434, word line (WL) contacts 436, 437, bit line (BL) contacts 438, source line (SL) contacts 440, and array interconnect layer 442. Memory stack 420 can be configured to include a core region (e.g., memory strings 300, backside GLS 434) and a step area (e.g., staircase structure 422 for WL contacts 436, 437) to address individual memory cells of memory string 300. Memory stack 420 can include dummy channel holes 415, conductor layer 416, dielectric layer 418, and staircase structure 422.

As shown in FIG. 4, staircase structure 422 can be formed from alternating conductor and dielectric layers 416, 418 to provide interconnect platforms (e.g., for WL contacts 436, 437). In some aspects, alternating conductor and dielectric layers 416, 418 can be formed from a selective etch and a subsequent conductive refill process, for example, manufacturing method 500 shown in FIGS. 5A through 5Q. In some aspects, conductor layer 416, WL contacts 436, 437 can include a conductive material (e.g., metal, polysilicon, tungsten, etc.).

In some aspects, as shown in FIG. 4, memory stack 420 can include one or more dummy channel holes 415. Dummy channel holes 415 can be configured to provide mechanical support to memory strings 300 and do not have any memory functions. In some aspects, dummy channel holes 415 can include a dielectric (e.g., oxide, nitride, etc.).

Memory string 300 can be configured to store memory (e.g., electrical charge) on one or more memory cells (e.g., memory cells 308 shown in FIG. 3). Memory string 300 shown in FIG. 4 can be similar to memory string 300 shown in FIG. 3.

As shown in FIG. 4A, each memory string 300 (e.g., NAND string) can extend vertically (along the Z-direction) through the inner region of memory stack 420 and include pillar 310 and insulating layer 312 (also known as a "memory film"). Each memory string 300 can have a cylindrical shape (e.g., a pillar shape) with insulating layer 312 surrounding pillar 310. Pillar 310 can include channel 310a, doped channel 310b (also known as "source contact"), and/or filling layer 310c (e.g., an insulator). In some aspects, as shown in FIG. 4A, pillar 310 can include filling layer 310c (e.g., an oxide) arranged in the center of pillar 310 such that channel 310a radially surrounds filling layer 310c and filling layer 310c extends partially along memory string 300 in the Z-direction (e.g., covering the storage layers) but channel 310a fills the remaining (upper) portion of pillar 310 (e.g., at bit line contact 438). In some aspects, as shown in FIG. 4A, a lower portion of channel 310a can be doped (e.g., via ion implantation) to form doped channel 310b at a lower portion of pillar 310 (e.g., at source line contact 440).

In some aspects, channel 310a can include a semiconductor material, for example, silicon, such as amorphous silicon, polysilicon, or single crystalline silicon. In some aspects, insulating layer 312 can be a composite layer including tunnel layer 312a, storage layer 312b (also known as a "charge trapping layer" or "floating gate"), and blocking layer 312c (also known as a "gate oxide"). In some aspects, channel 310a, tunnel layer 312a, storage layer 312b, and blocking layer 312c are arranged radially from the center toward the outer surface of memory string 300 in this order. In some aspects, channel 310a, tunnel layer 312a, storage layer 312b, tunnel layer 312a, and blocking layer 312c are arranged radially from the center toward the outer surface of memory string 300 in this order.

In some aspects, insulating layer 312 can include tunnel layer 312a, charge trapping layer 312b, and gate oxide 312c. For example, memory string 300 can be used for charge trap flash (CTF) and charge trapping layer 312b can hold an electric charge. In some aspects, charge trapping layer 312b can be an insulator. For example, charge trapping layer 312b can include silicon nitride, silicon oxynitride, silicon oxide, or any combination thereof. In some aspects, insulating layer 312 can include tunnel layer 312a, floating gate 312b, and gate oxide 312c. For example, memory string 300 can be used for floating gate and floating gate 312b can hold an electric charge. In some aspects, floating gate 312b can be a conductor. For example, floating gate 312b can include silicon, polysilicon, a metal (e.g., Al, W, etc.), or any combination thereof. In some aspects, tunnel layer 312a can include silicon oxide, silicon oxynitride, or any combination thereof. In some aspects, storage layer 312b can include silicon nitride, silicon oxynitride, silicon, or any combination thereof. In some aspects, blocking layer 312c can include silicon oxide, silicon oxynitride, high dielectric constant (high-k) dielectrics, or any combination thereof.

Figures 12, 13:
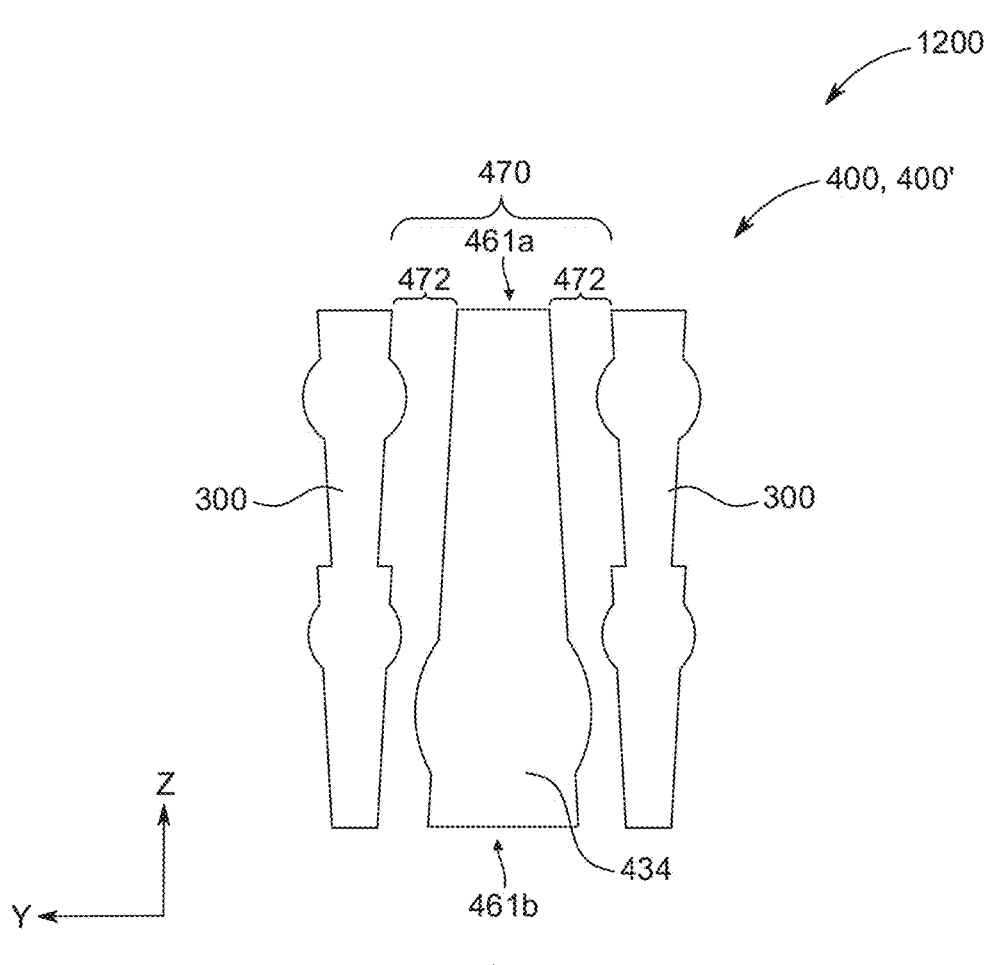
FIG. 12 is a schematic partial cross-sectional illustration of the 3D memory devices shown in FIGS. 4 and 6, according to an exemplary aspect.
FIG. 13 is a schematic partial cross-sectional illustration of the 3D memory devices shown in FIGS. 4 and 6, according to an exemplary aspect.

In some aspects, memory string 300 can be tapered towards backside 461b of memory array device 460. For example, as shown in FIG. 12, memory string 300 can be tapered (e.g., decreasing diameter) from a top end (e.g., adjacent frontside 461a shown in FIG. 4) to a bottom end (e.g., adjacent backside 461b shown in FIG. 4).

Figures 6, 6A:
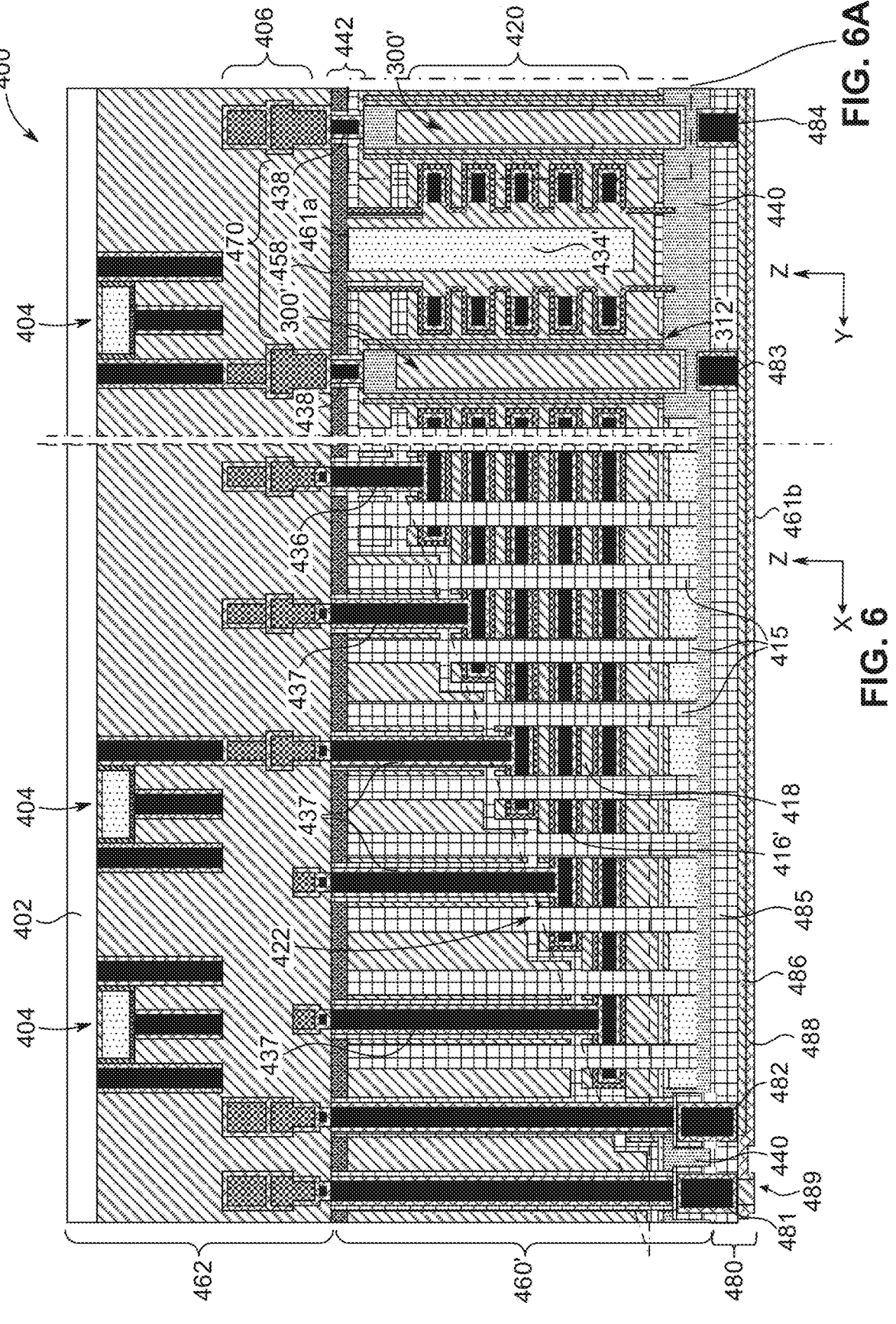
FIG. 6 is a schematic cross-sectional illustration of a 3D memory device, according to an exemplary aspect.
FIG. 6A is a schematic magnified cross-sectional illustration of a memory string of the 3D memory device shown in FIG. 6.
Figure 6A:
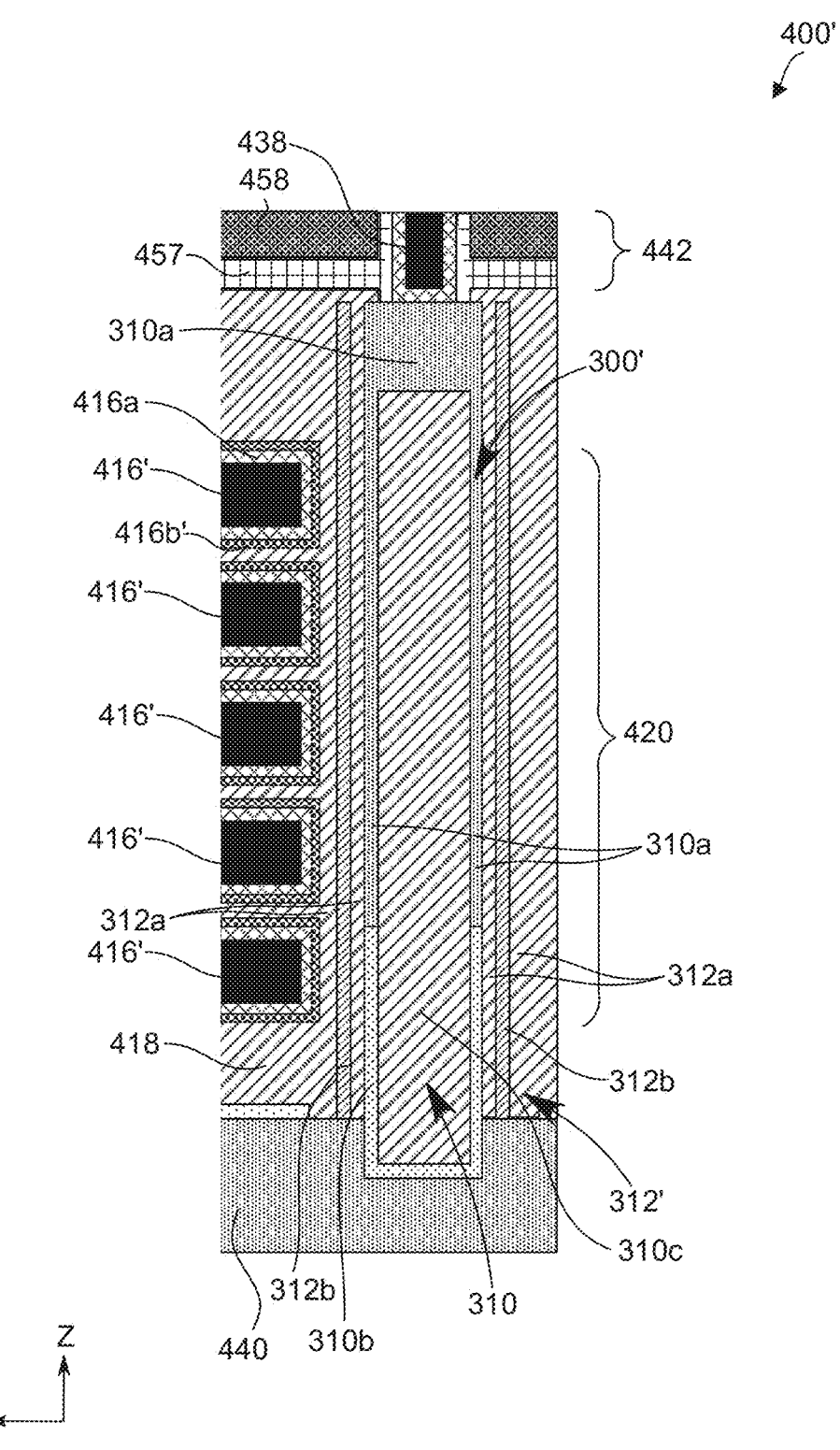

Backside GLS 434 can be configured to reduce wafer bow between memory array device 460 and peripheral device 462. Backside GLS 434 can be further configured to reduce thermal stress in memory array device 460 to thereby avoid thermal treatment (e.g., rapid thermal annealing (RTA)), for example, after bonding peripheral device 462 to memory array device 460. Backside GLS 434 can be further configured to reduce contamination (e.g., fluorine) in peripheral device 462 to thereby avoid thermal diffusion (e.g., due to RTA), for example, after bonding peripheral device 462 to memory array device 460 by forming backside GLS 434 rather than a frontside GLS. As shown in FIG. 4, backside GLS 434 can extend through backside 461b of memory array device 460. In some aspects, backside GLS 434 can include an array common source (ACS) conductive structure coupled to memory strings 300. For example, as shown in FIG. 6, backside GLS 434' can be coupled to HKMG stack 416', for example, along sidewalls of. In some aspects, memory string 300 can be tapered towards backside 461b of memory array device 460 and backside GLS 434 can be tapered towards frontside 461a of memory array device 460, thereby increasing overlay step area 472 (e.g., lateral distance between an exterior of backside GLS 434 and an exterior of memory string 300) of overlay window 470 between backside GLS 434 and memory string 300. For example, as shown in FIG. 12, memory string 300 can be tapered (e.g., decreasing diameter) from a top end (e.g., adjacent frontside 461a shown in FIG. 4) to a bottom end (e.g., adjacent backside 461b shown in FIG. 4) and backside GLS 434 can be tapered (e.g., decreasing diameter) from a bottom end (e.g., adjacent backside 461b shown in FIG. 4) to a top end (e.g., adjacent front side 461a shown in FIG. 4).

As shown in FIG. 4, memory array device 460 can include overlay window 470 between memory string 300 and backside GLS 434. For example, as shown in FIG. 12, overlay window 470 can include overlay step area 472 between backside GLS 434 and adjacent memory strings 300. In some aspects, backside GLS 434 and memory string 300 can be fabricated on opposite sides of memory array device 460, for example, memory string 300 can be fabricated on frontside 461a and backside GLS 434 can be fabricated on backside 461b, thereby increasing overlay step area 472 (e.g., increasing available patterning area) and decreasing overlay misalignment (e.g., between backside GLS 434 and memory string 300, between backside GLS 434 and array interconnect layer 442, etc.). As shown in FIGS. 4 and 12, overlay step area 472 is the horizontal distance (e.g., along the Y-axis) between backside GLS 434 (e.g., an exterior edge) and an adjacent memory string 300 on frontside 461a. By having backside GLS 434 and memory strings 300 formed on opposite sides (e.g., backside GLS 434 fabricated on backside 461b and memory strings 300 fabricated on frontside 461a), overlay step area 472 is larger compared to fabricating backside GLS 434 and memory strings on the same side (e.g., overlay step area 172 shown in FIG. 10), which can increase reliability when patterning. Overall, the horizontal distance (e.g., along the Y-axis) represented by overlay step area 472 between backside GLS 434 and adjacent memory strings 300 is increased (compared to overlay step area 172 shown in FIG. 10) which improves alignment (e.g., overlay alignment). In some aspects, 3D memory device 400 can decrease wafer bow between memory array device 460 and peripheral device 462, for example, due to backside GLS 434 and the omission of thermal processing (e.g., thermal stress) during or after bonding peripheral device 462 to memory array device 460. For example, as shown in FIG. 13, memory array device 460 can have a decreased wafer bow (e.g., roughly planar surface) relative to peripheral device 462 thereby decreasing bonding and overlay misalignment.

FIG. 6 illustrates 3D memory device 400', according to exemplary aspects. FIG. 6 is a schematic cross-sectional illustration of 3D memory device 400' with memory string 300' and backside GLS 434', according to an exemplary aspect. FIG. 6A is a schematic magnified cross-sectional illustration of memory string 300' of 3D memory device 400' shown in FIG. 6. Although 3D memory device 400' is shown in FIG. 6 as a stand-alone apparatus and/or system, the aspects of this disclosure can be used with other apparatuses, systems, and/or methods, such as, but not limited to, memory system 100, memory device 108, memory string 300, 3D memory device 400, manufacturing method 500, manufacturing method 500', flow diagram 800, and/or flow diagram 900.

The aspects of 3D memory device 400 shown in FIGS. 4 and 4A, for example, and the aspects of 3D memory device 400' shown in FIGS. 6 and 6A may be similar. Similar reference numbers are used to indicate features of the aspects of 3D memory device 400 shown in FIGS. 4 and 4A and the similar features of the aspects of 3D memory device 400' shown in FIGS. 6 and 6A. 3D memory device 400' includes memory array device 460' with conductor layer 416', memory string 300', and backside GLS 434' rather than conductor layer 416, memory string 300, and backside GLS 434 of memory array device 460 shown in FIG. 4. Further, backside GLS 434' directly contacts etch stop layer 458 rather than backside GLS 434 that contacts top isolation layer 457 (e.g., an oxide) disposed between etch stop layer 458 and backside GLS 434.

As shown in FIG. 6, 3D memory device 400' can include memory array device 460', peripheral device 462, and pad-out interconnection layer 480. Memory array device 460' can include conductor layer 416', memory string 300', and backside GLS 434'. In some aspects, conductor layer 416' can be formed from a selective etch and a subsequent HKMG stack refill process, for example, manufacturing method 500' shown in FIGS. 7A through 7Q. In some aspects, insulating layer 312' of memory string 300' can be a composite layer including tunnel layer 312a and storage layer 312b (also known as a "charge trapping layer" or "floating gate"). In some aspects, channel 310a, tunnel layer 312a, storage layer 312b, and tunnel layer 312a are arranged radially from the center toward the outer surface of memory string 300' in this order. In some aspects, insulating layer 312' of memory string 300' can include oxide, nitride, oxide-nitride-oxide (ONO), silicon, and/or a combination thereof. In some aspects, charge trapping layer 312b can be an insulator. For example, charge trapping layer 312b can include silicon nitride, silicon oxynitride, silicon oxide, or any combination thereof. In some aspects, floating gate 312b can be a conductor. For example, floating gate 312b can include silicon, polysilicon, a metal (e.g., Al, W, etc.), or any combination thereof. In some aspects, insulating layer 312' of memory string 300' can omit a high-k dielectric layer (e.g., gate oxide). For example, as shown in FIG. 6A, insulating layer 312' of memory string 300' can include tunnel layers 312a and storage layer 312b without a high-k dielectric layer (e.g., without blocking layer 312c shown in FIG. 4A). In some aspects, backside GLS 434' can be formed from a selective etch and a subsequent HKMG stack refill process, for example, manufacturing method 500' shown in FIGS. 7A through 7Q.

Exemplary Manufacturing Methods

Figures 5A, 5B:
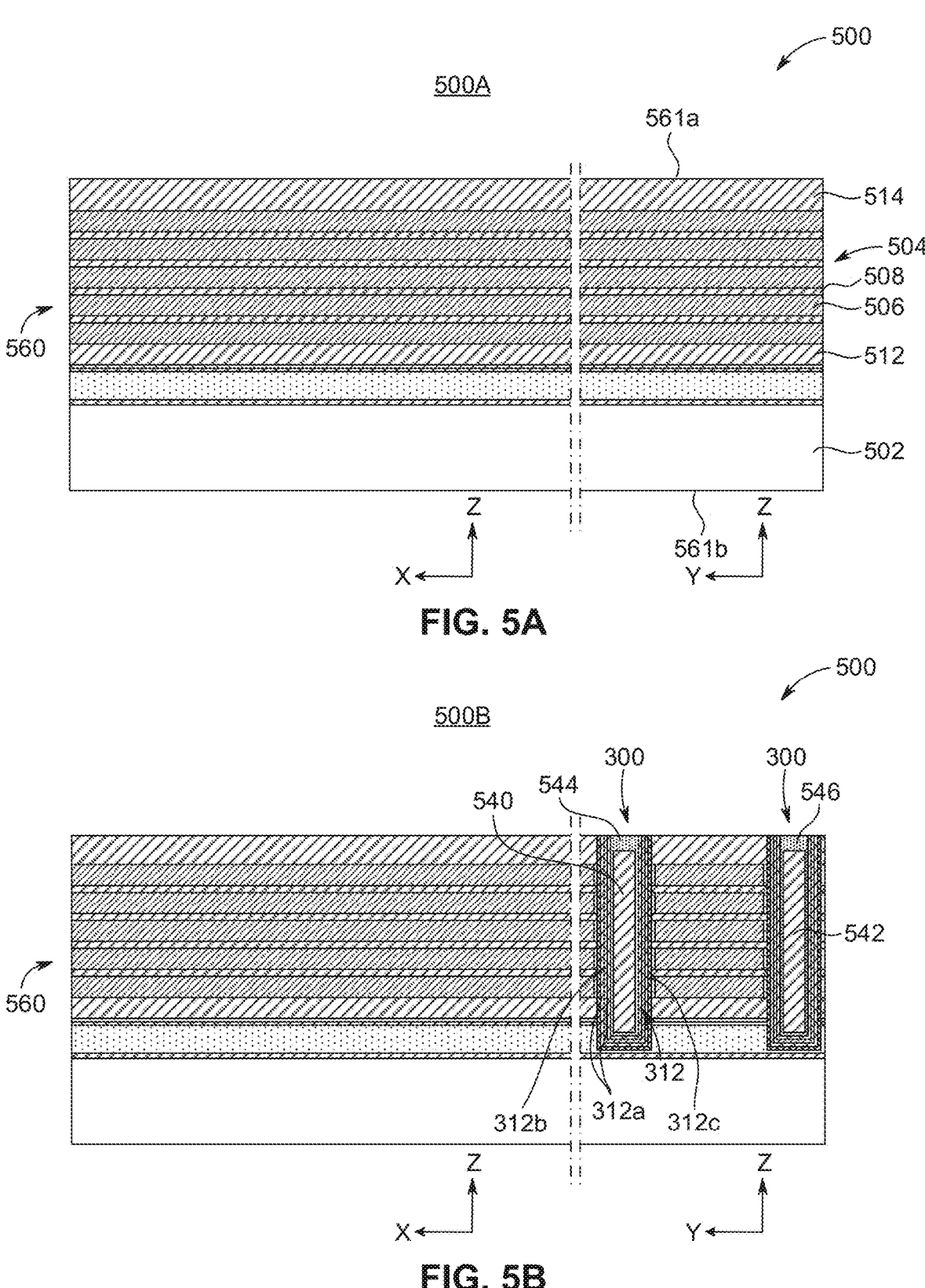
FIGS. 5A through 5Q illustrate a manufacturing method for forming the 3D memory device shown in FIG. 4, according to exemplary aspects.
Figure 5C:
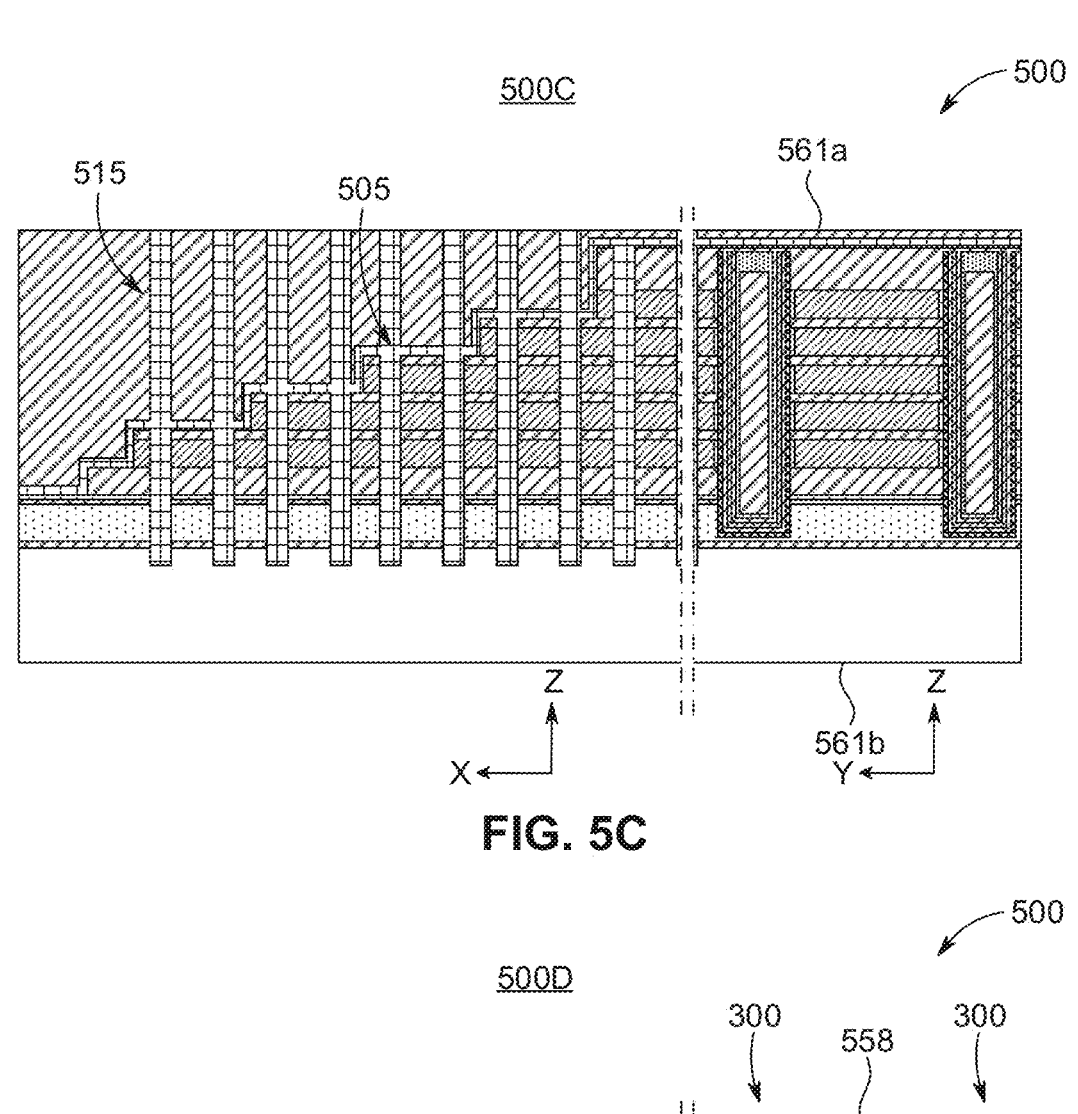
Figure 5D:
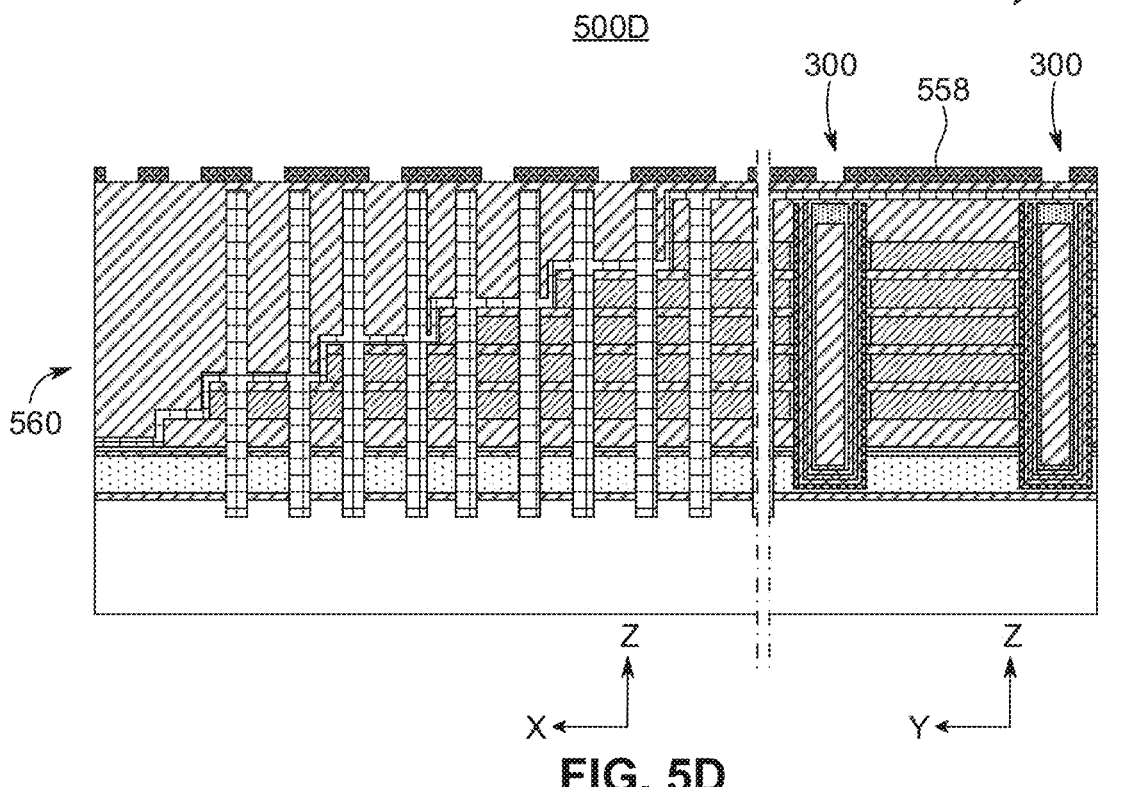
Figures 5E, 5F:
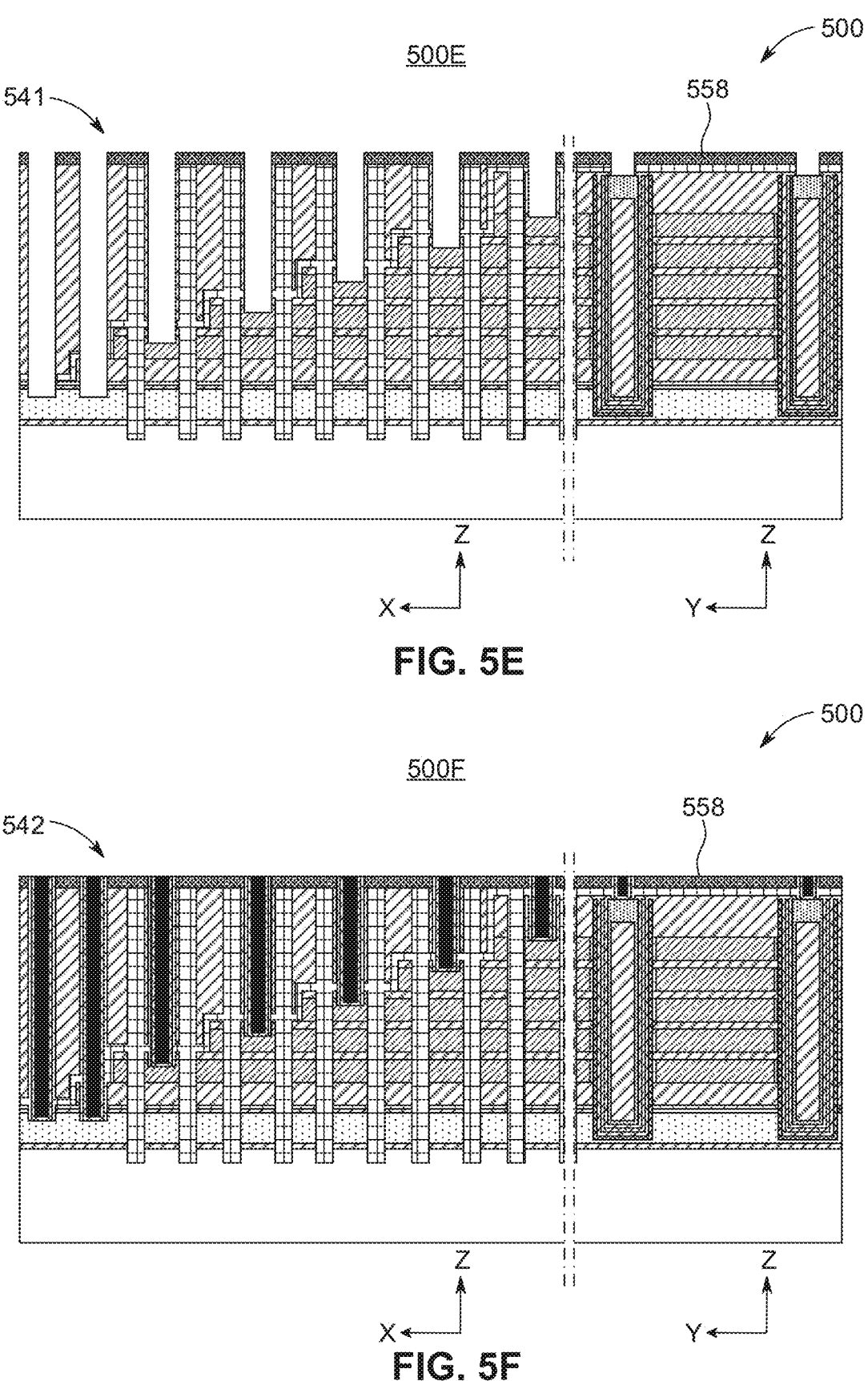
Figures 5G, 5H:
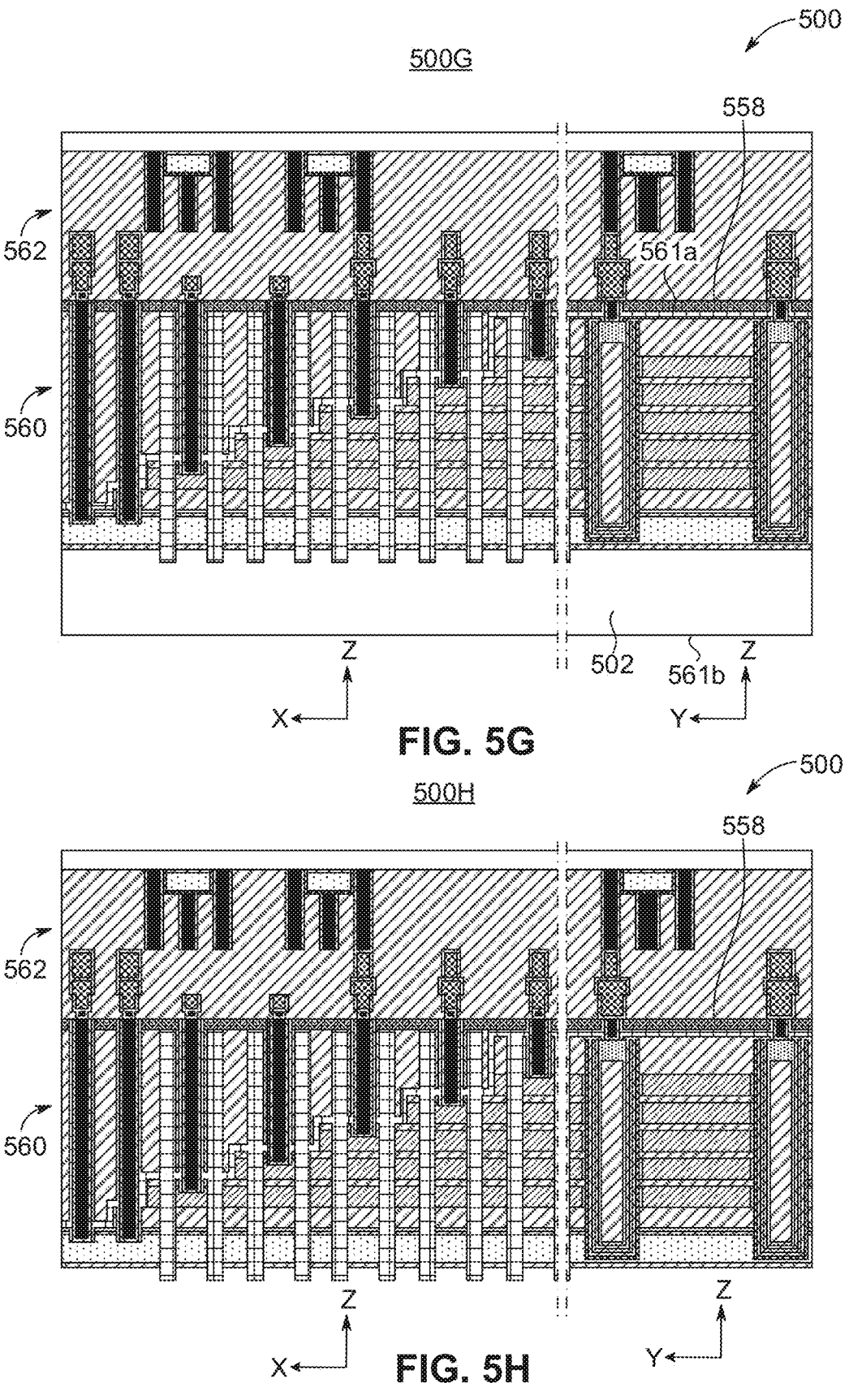
Figures 5I, 5J:
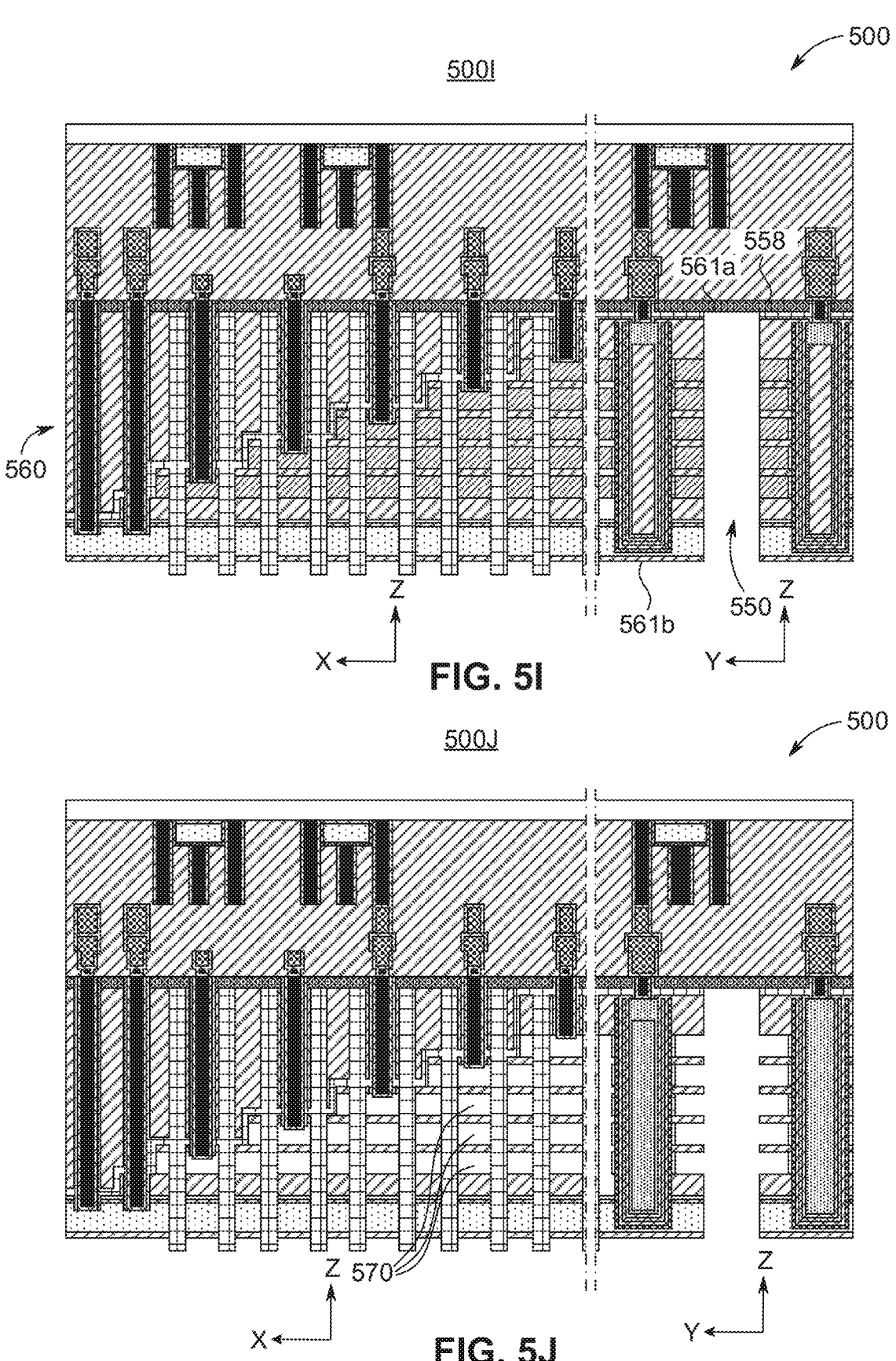
Figures 5O, 5P:
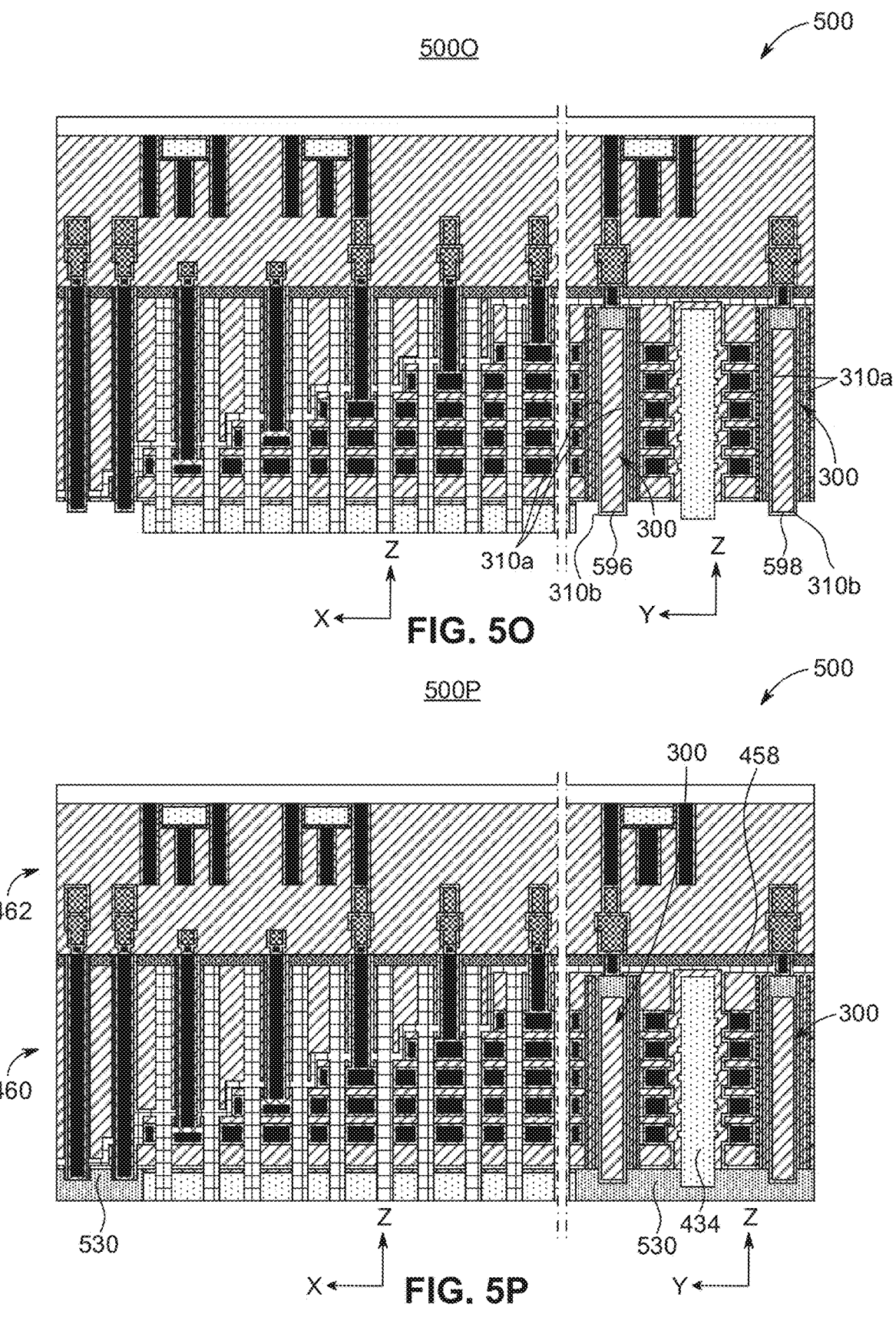
Figure 5Q:
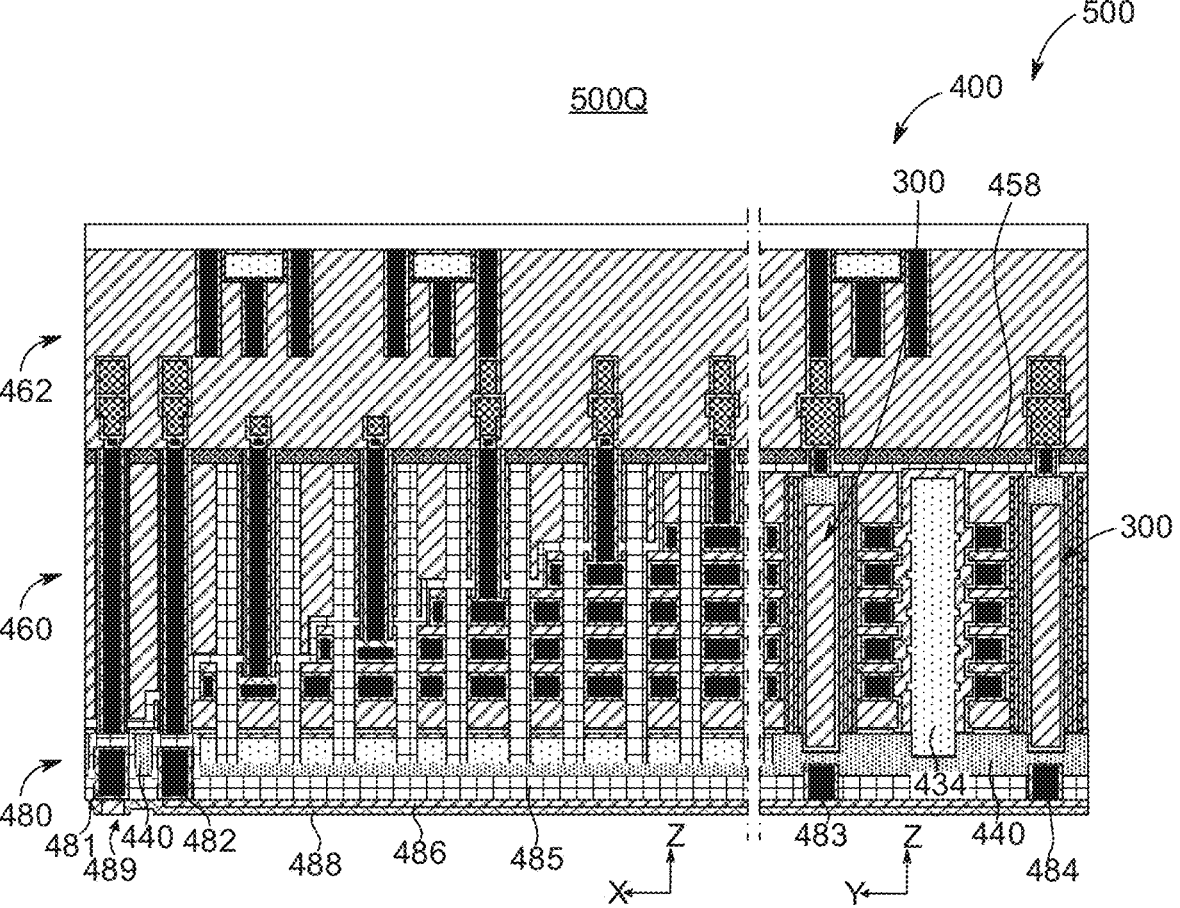

FIGS. 5A through 5Q illustrate manufacturing method 500 for forming 3D memory device 400 shown in FIG. 4, according to exemplary aspects. It is to be appreciated that not all steps in FIGS. 5A through 5Q are needed to perform the disclosure provided herein. Further, some of the steps may be performed simultaneously, sequentially, and/or in a different order than shown in FIGS. 5A through 5Q. Manufacturing method 500 shall be described with reference to FIGS. 5A through 5Q. However, manufacturing method 500 is not limited to those example aspects. In some aspects, manufacturing method 500 can decrease wafer bow and thermal stress and decrease bonding and overlay misalignments by forming backside GLS 434 on backside 461b of memory array device 460 (e.g., opposite etch stop layer 458) rather than on frontside 461a of memory array device 460 (e.g., adjacent etch stop layer 458). In some aspects, manufacturing method 500 can decrease diffusion of contaminants (e.g., fluorine), for example, by omitting a thermal processing step (e.g., RTA step) due to backside GLS 434 being formed after bonding peripheral device 462 to memory array device 460 of 3D memory device 400 shown in FIG. 4.

In step 500A, as shown in the example of FIG. 5A, dielectric stack 504 with first dielectric layer 508 (e.g., silicon oxide), second dielectric layer 506 (e.g., silicon nitride), bottom isolation layer 512, and top isolation layer 514 are formed as an alternating dielectric stack atop substrate 502 to form memory array device 560 with frontside 561a and backside 561b.

In step 500B, as shown in the example of FIG. 5B, memory strings 300 with first and second pillars 540, 542 and first and second top contacts 544, 546 are formed in the alternating dielectric stack (e.g., dielectric stack 504). In some aspects, as shown in FIGS. 4A and 5B, memory strings 300 can include insulating layer 312 with tunnel layer 312a, storage layer 312b, and blocking layer 312c (e.g., high-k dielectric layer), where blocking layer 312c surrounds storage layer 312b and tunnel layer 312a surrounds first and second pillars 540, 542, respectively. In some aspects, memory strings 300 can be formed by forming first and second channel (CH) holes (e.g., anisotropic etch) in the alternating dielectric stack and subsequently forming (e.g., depositing), in order, blocking layer 312c (e.g., high-k dielectric layer), storage layer 312b (e.g., silicon nitride or conductive layer), tunnel layer 312a (e.g., oxide layer), and first and second pillars 540, 542. In some aspects, forming first and second top contacts 544, 546 can include doping first and second pillars 540, 542 (e.g., doping a top portion of channel 310a of pillar 310 shown in FIG. 4A) to form first and second top contacts 544, 546, for example, by ion implanting.

In step 500C, as shown in the example of FIG. 5C, staircase structure 505 and dummy channel holes 515 are formed in alternating dielectric stack (e.g., dielectric stack 504). In some aspects, dummy channel holes 515 can be silicon oxide. In some aspects, dummy channel holes 515 can include a high-k dielectric, an oxide, a nitride, or a combination thereof. In some aspects, staircase structure 505 can be formed by using a step etch stop layer to expose and etch portions of the alternating dielectric stack (e.g., dielectric stack 504) along the Z-direction (e.g., via photolithography and subsequent etching).

In step 500D, as shown in the example of FIGS. 4 and 5D, etch stop layer 558 is formed (e.g., deposited and patterned) on frontside 561a of memory array device 560. In some aspects, etch stop layer 558 can be patterned (e.g., via photolithography and subsequent etching) to expose portions of etch stop layer 558 corresponding to interconnects (e.g., interconnects 542 shown in FIG. 5F). In some aspects, as shown in FIG. 5D, etch stop layer 558 extends entirely across a distance between adjacent memory strings 300 (e.g., across overlay window 470 shown in FIG. 4.)

In step 500E, as shown in the example of FIG. 5E, interconnect trenches 541 are formed (e.g., anisotropic etch) in the alternating dielectric stack (e.g., dielectric stack 504) corresponding to the exposed areas of etch stop layer 558.

In step 500F, as shown in the example of FIG. 5F, interconnects 542 are formed (e.g., deposited) in interconnect trenches 541 with a conductive material (e.g., polysilicon, tungsten, aluminum, a metal, or any other conductive material).

In step 500G, as shown in the example of FIG. 5G, peripheral device 562 is bonded to frontside 561a of memory array device 560 (e.g., etch stop layer 558). In some aspects, peripheral device 562 is hybrid bonded (e.g., Xtacking) to memory array device 560 to simultaneously bond and connect interconnect contacts between peripheral device 562 and memory array device 560.

In step 500H, as shown in the example of FIG. 5H, substrate 502 of memory array device 560 is removed (e.g., selective etch, chemical mechanical polishing (CMP), etc.).

In step 500I, as shown in the example of FIG. 5I, backside gate line trench 550 is formed in the alternating dielectric stack (e.g., dielectric stack 504). In some aspects, backside gate line trench 550 extends through backside 561b of memory array device 560 to etch stop layer 558. In some aspects, etch stop layer 558 stops the etching of backside gate line trench 550 from backside 561b to frontside 561a of memory array device 560 at the etch stop layer 558 (e.g., at the frontside 561a). In some aspects, backside gate line trench 550 can be formed by etching alternating dielectric stack, for example, anisotropic etching.

In step 500J, as shown in the example of FIG. 5J, second dielectric layer 506 (e.g., silicon nitride) of dielectric stack 504 is removed to form dielectric layer void 570. In some aspects, second dielectric layer 506 can be removed by etching from a lateral edge of dielectric stack 504, for example, isotropic etching.

In step 500K, as shown in the example of FIG. 5K, conductive layers 506' are formed in dielectric layer void 570 and conductive layer 590 is formed in backside gate line trench 550. In some aspects, conductive layer 590 can include polysilicon, tungsten, aluminum, a metal, or any other conductive material. In some aspects, as shown in FIG. 5K, first gate line insulating layer 557 and second gate line insulating layer 556 can be formed in backside gate line trench 550 and surround conductive layer 590. For example, second gate line insulating layer 556, first gate line insulating layer 557, and conductive layer 590 can be subsequently formed (e.g., deposited), in order, in backside gate line trench 550 such that second gate line insulating layer 556 surrounds first gate line insulating layer 557 and first gate line insulating layer 557 surrounds conductive layer 590. In some aspects, first gate line insulating layer 557 can include a high-k dielectric, an oxide, a nitride, or a combination thereof. In some aspects, second gate line insulating layer 556 can include a high-k dielectric, an oxide, a nitride, or a combination thereof.

In step 500L, as shown in the example of FIG. 5L, a portion of conductive layer 590 is removed (e.g., selective etch) to form etched conductive layer 591 and insulating layer 592 is exposed.

In step 500M, as shown in the example of FIG. 5M, protective cap layer 593 (e.g., oxide) is formed on a bottom portion of etched conductive layer 591 and insulating layer 592 is planarized (e.g., CMP) to form planar edge 594.

In step 500N, as shown in the example of FIGS. 4 and 5N, bottom portions of memory array device 560 are removed (e.g., anisotropic etch) to form bottom interconnect voids 595 corresponding to bottom contacts of memory strings 300, backside GLS 434, and source contacts 440.

In step 500O, as shown in the example of FIGS. 4, 5B, 5O, first and second bottom contacts 596, 598 are formed in bottom portions of memory strings 300. In some aspects, forming first and second bottom contacts 596, 598 can include doping bottom portions of memory strings 300 (e.g., bottom portions of first and second pillars 540, 542 shown in FIG. 5B), for example, by ion implanting. In some aspects, as shown in FIGS. 4A and 5O, a lower portion of channel 310a of memory strings 300 can be doped (e.g., by ion implanting) to form doped channel 310b to form first and second bottom contacts 596, 598 (e.g., source contacts).

In step 500P, as shown in the example of FIGS. 4 and 5P, source contacts 530 are formed in bottom interconnect voids 595 with a conductive material to connect bottom contacts of memory strings 300 (e.g., first and second bottom contacts 596, 598 shown in FIG. 5O) and backside GLS 434, and form source contacts 440 of 3D memory device 400 shown in FIG. 4. In some aspects, source contacts 530 can include polysilicon, tungsten, aluminum, a metal, or any other conductive material. In some aspects, manufacturing method 500 can include forming a 3D memory device, for example, 3D memory device 400 with backside GLS 434 shown in FIG. 4.

In step 500Q, as shown in the example of FIG. 5Q, pad interconnect 481, ACS interconnects 482, 483, 484, isolating layer 485, ACS connection layer 486, protective layer 488, and contact pad 489 can be formed on a bottom portion of memory array device 460 to form pad-out interconnection layer 480. In some aspects, manufacturing method 500 can include forming a memory string, for example, memory string 300 shown in FIG. 4. In some aspects, manufacturing method 500 can include forming a NAND memory string.

Figure 7A:
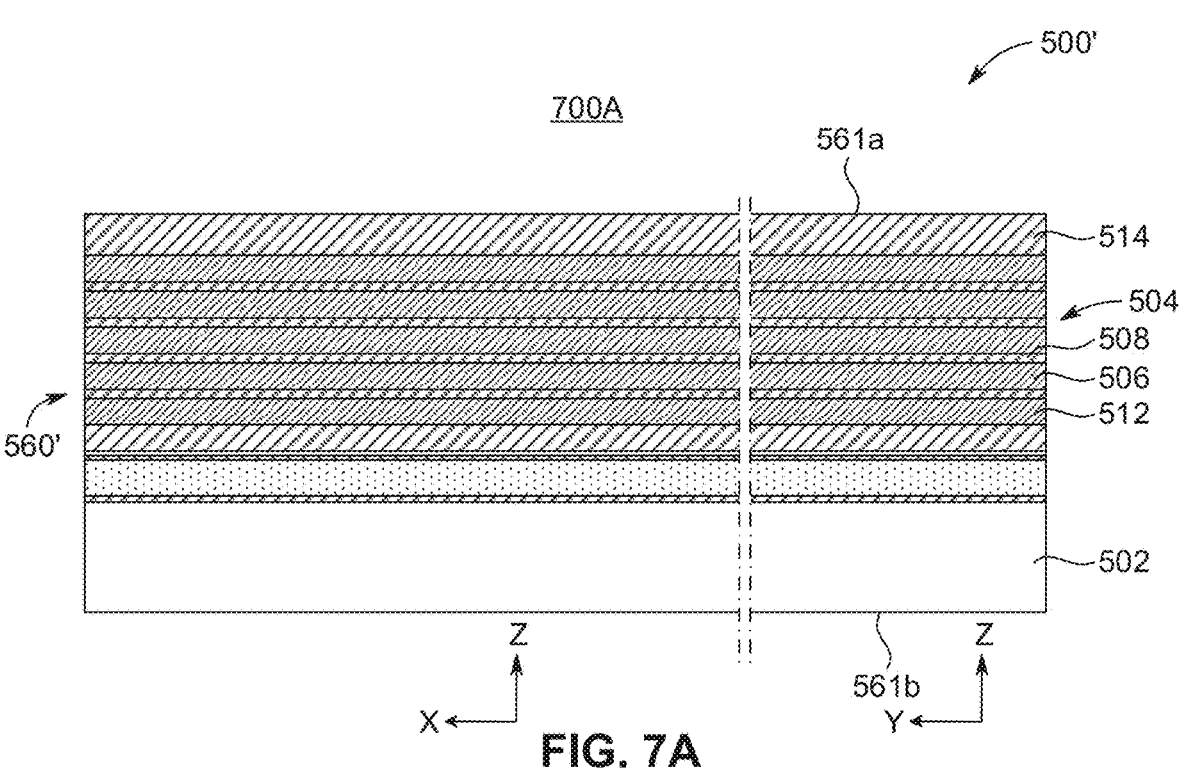
FIGS. 7A through 7Q illustrate a manufacturing method for forming the 3D memory device shown in FIG. 6, according to exemplary aspects.
Figure 7B:
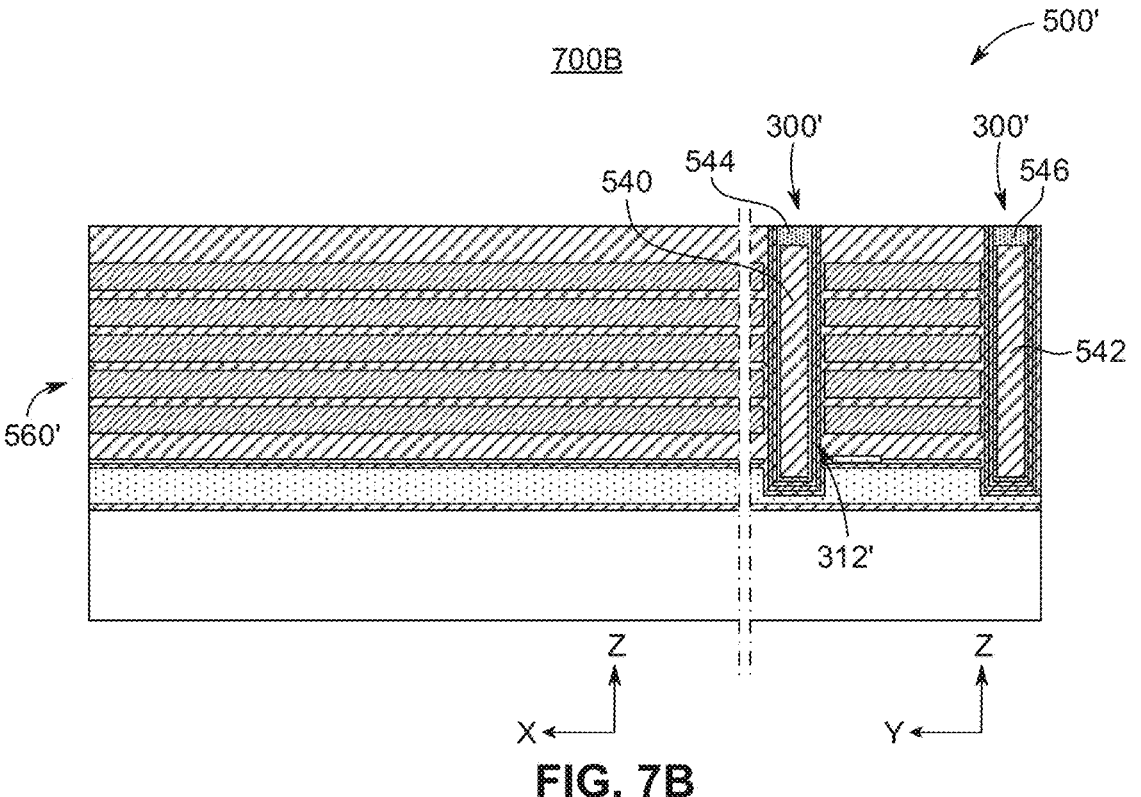
Figures 7C, 7D:
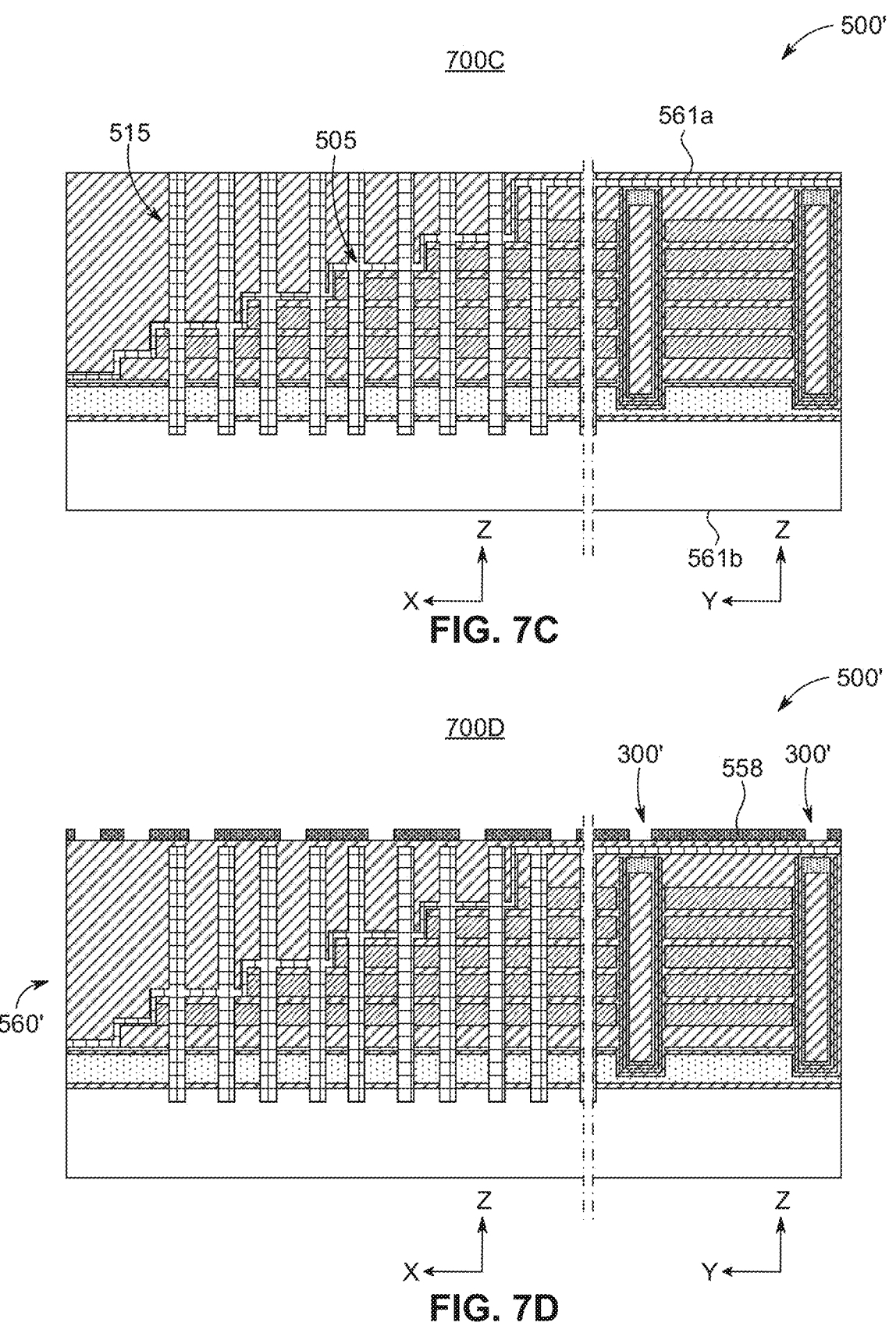
Figure 7E:
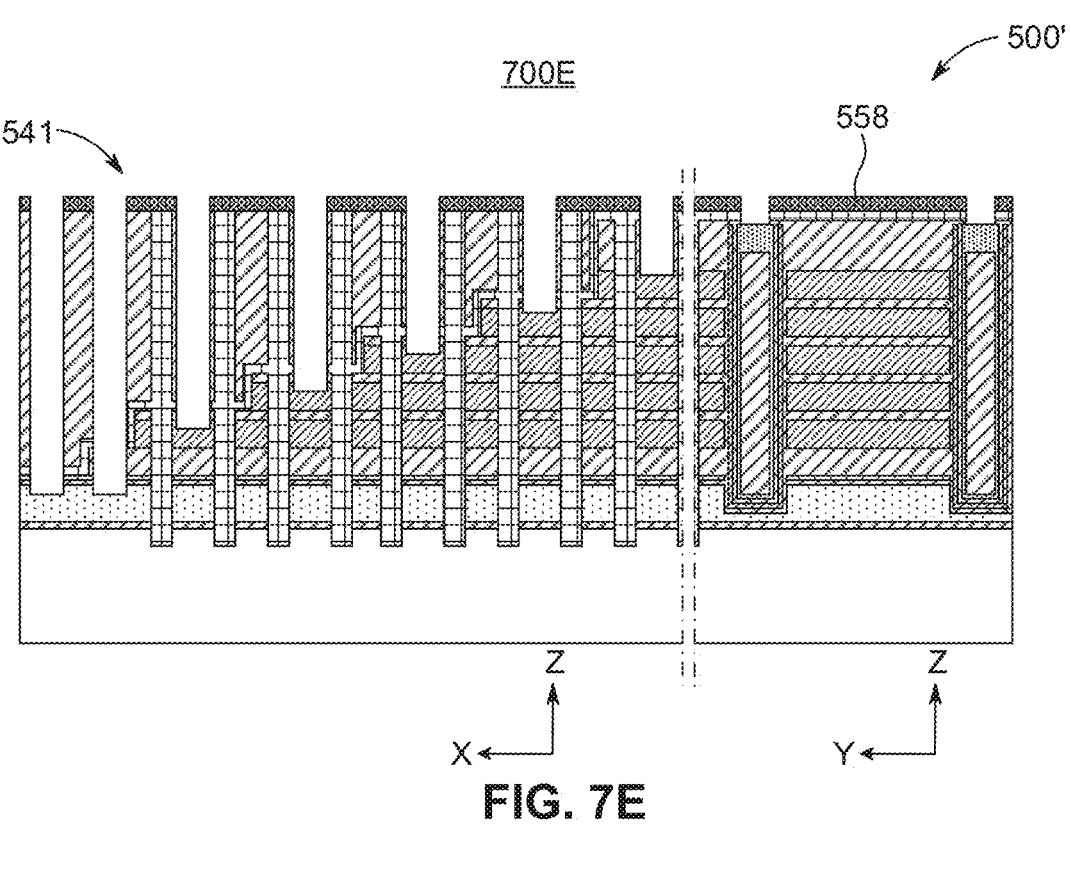
Figure 7F:
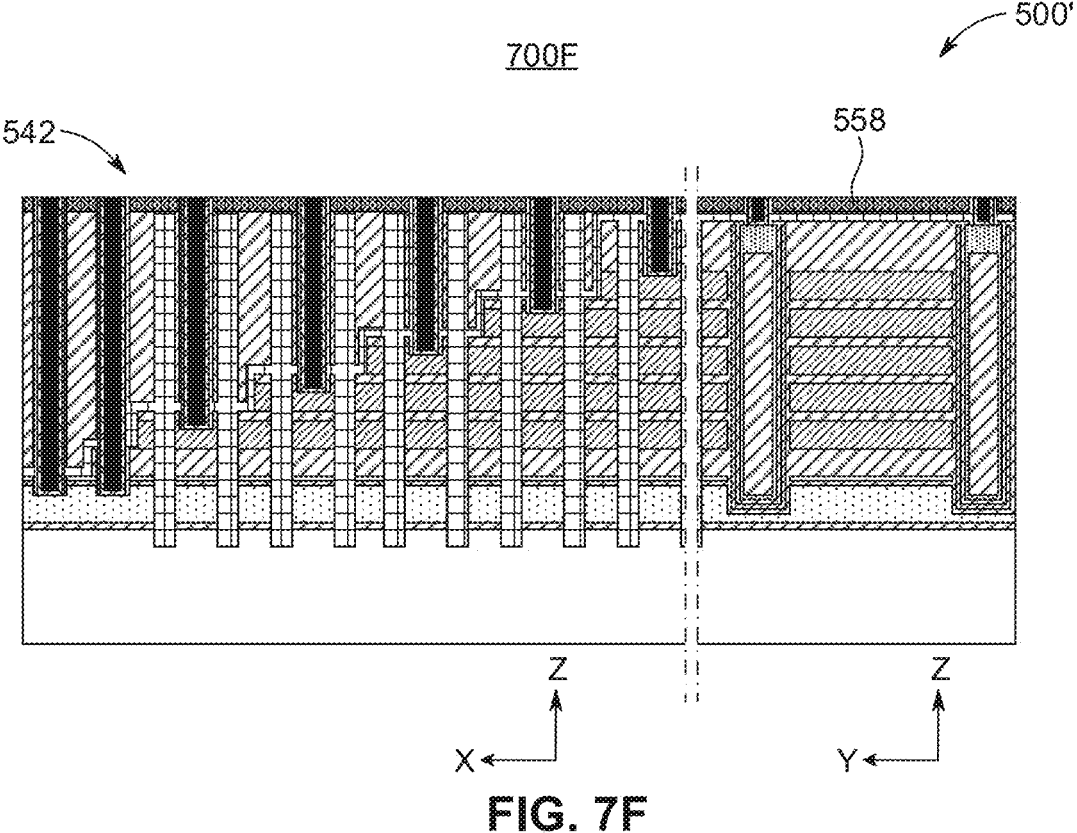
Figures 7G, 7H:
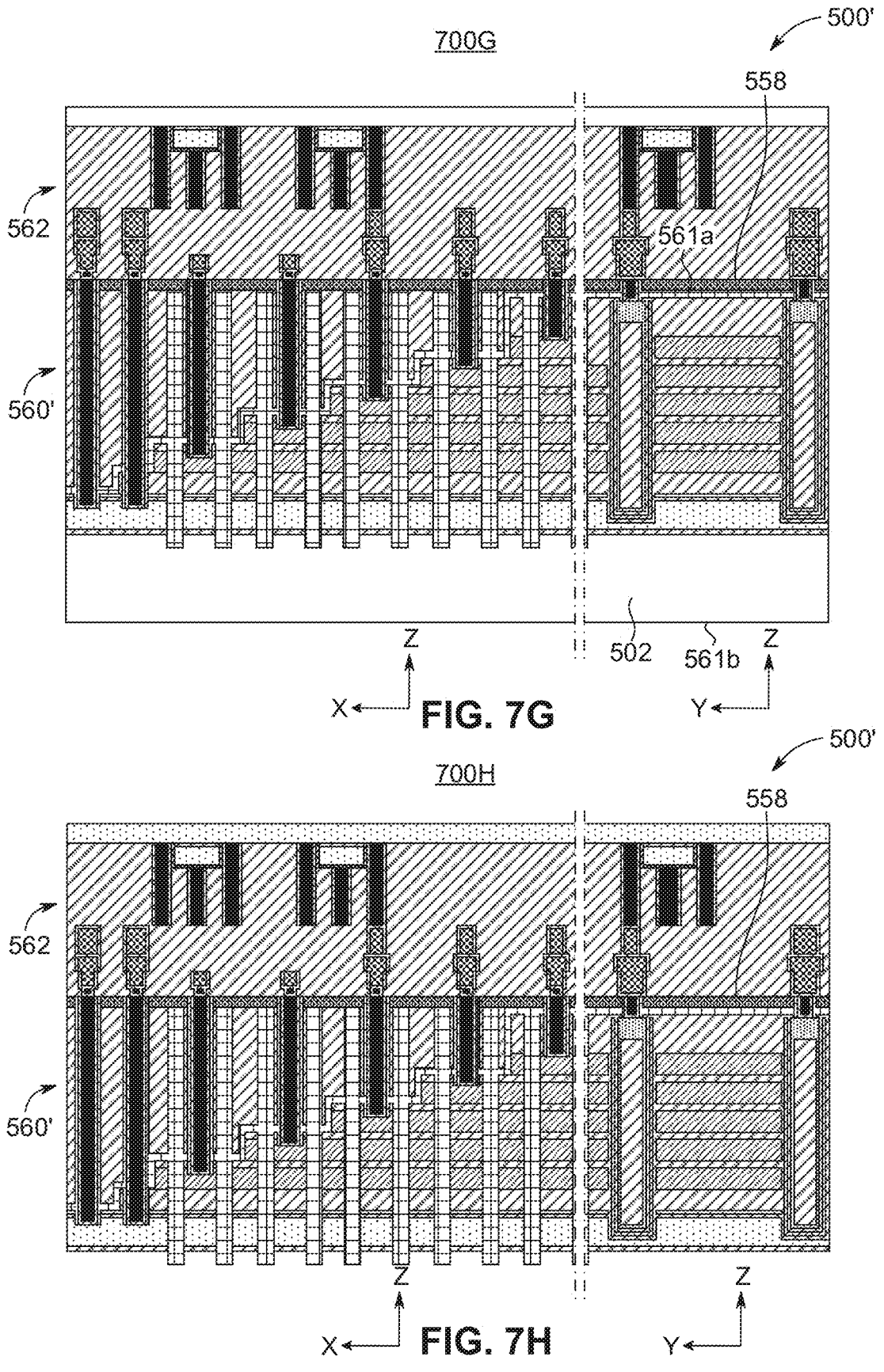
Figures 7I, 7J:
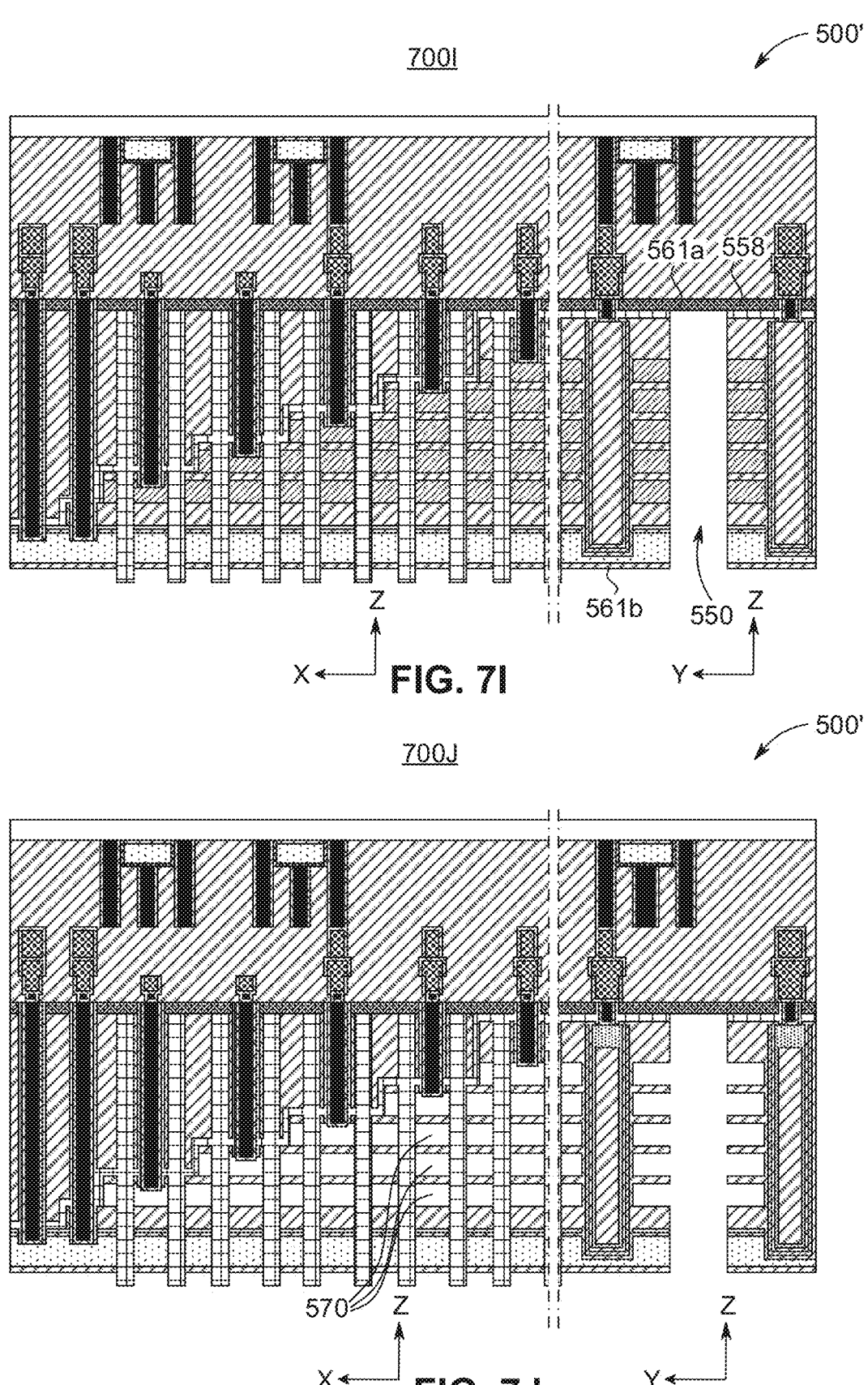
Figures 7K, 7L:
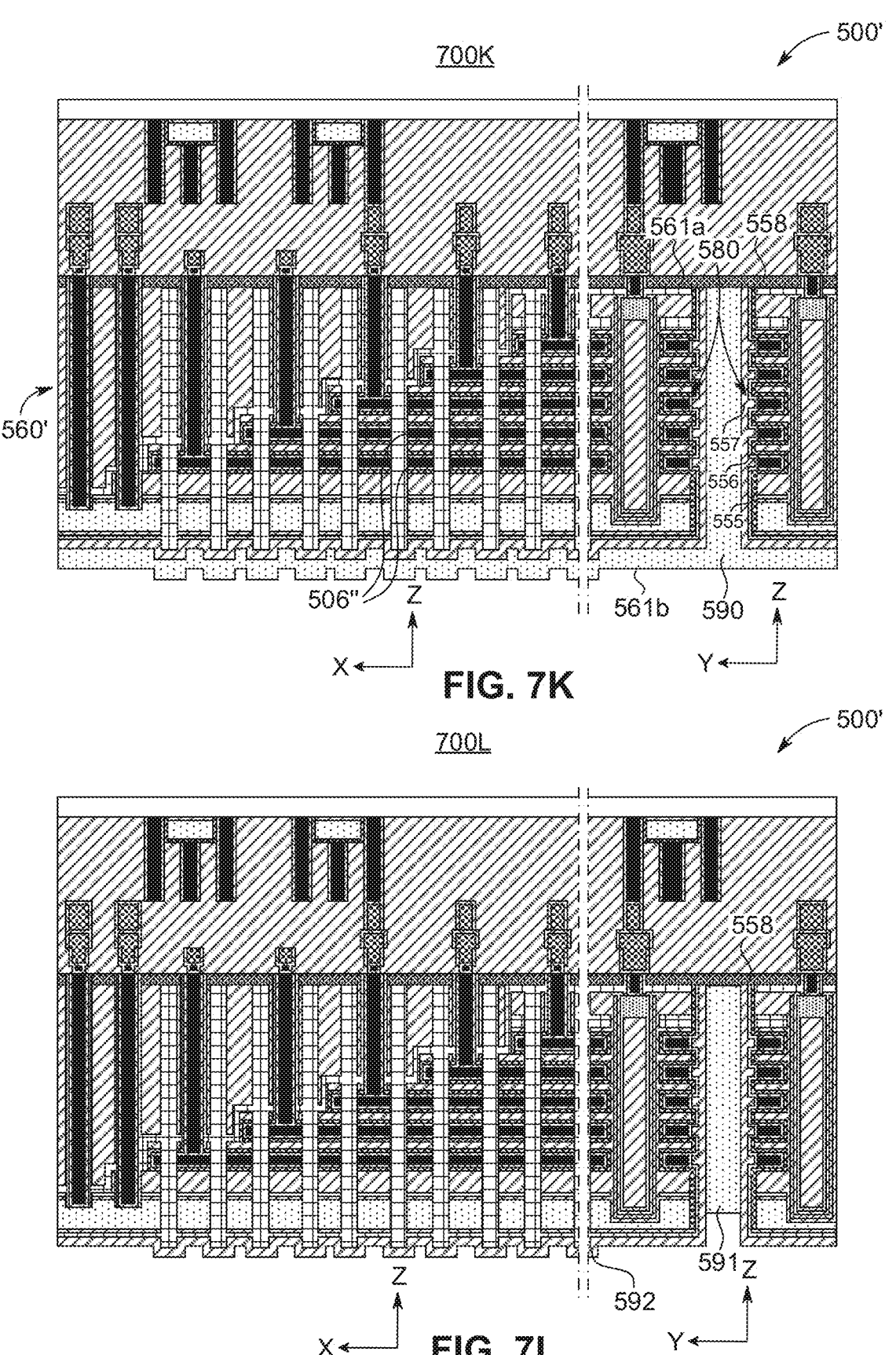
Figures 7O, 7P:
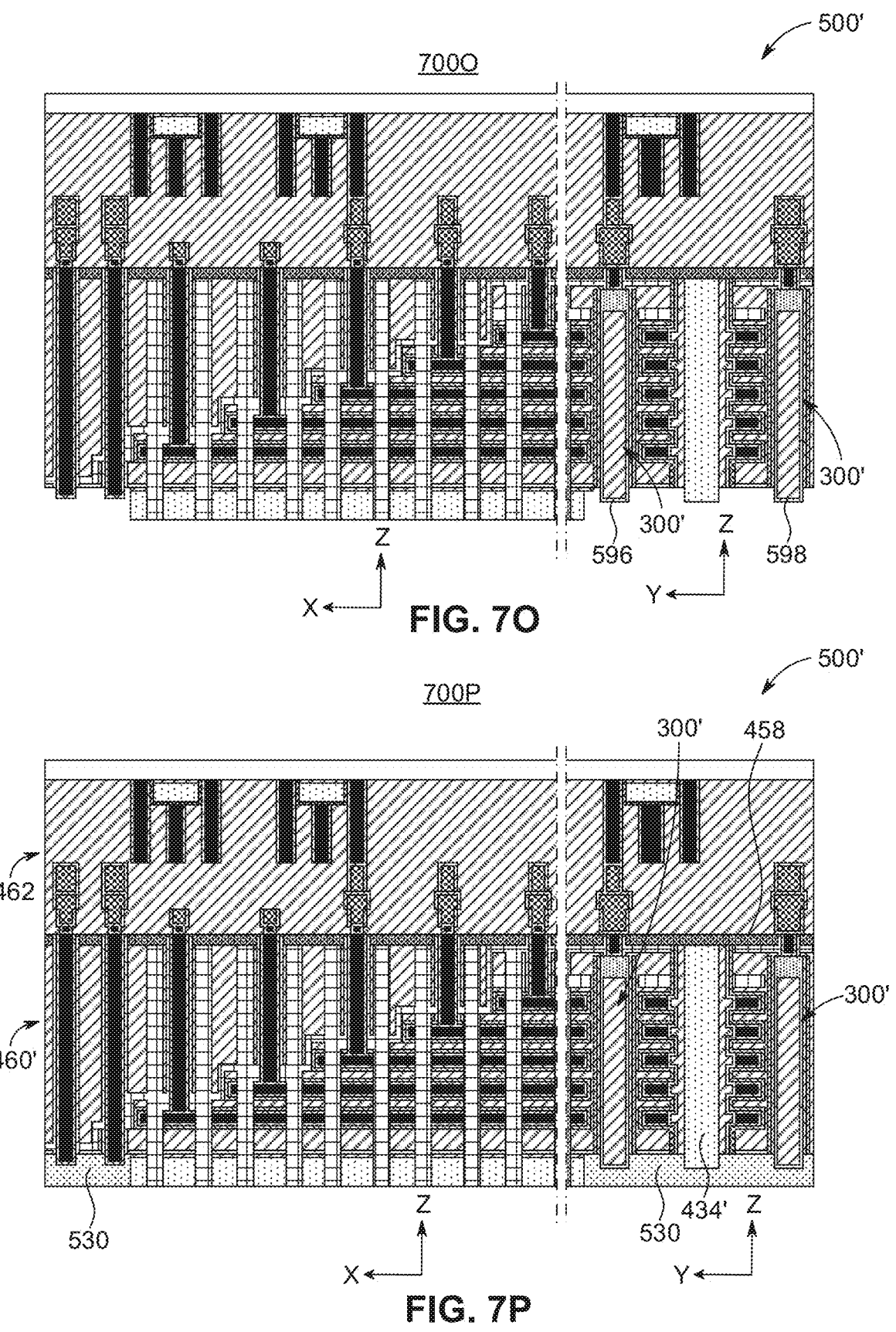
Figure 7Q:
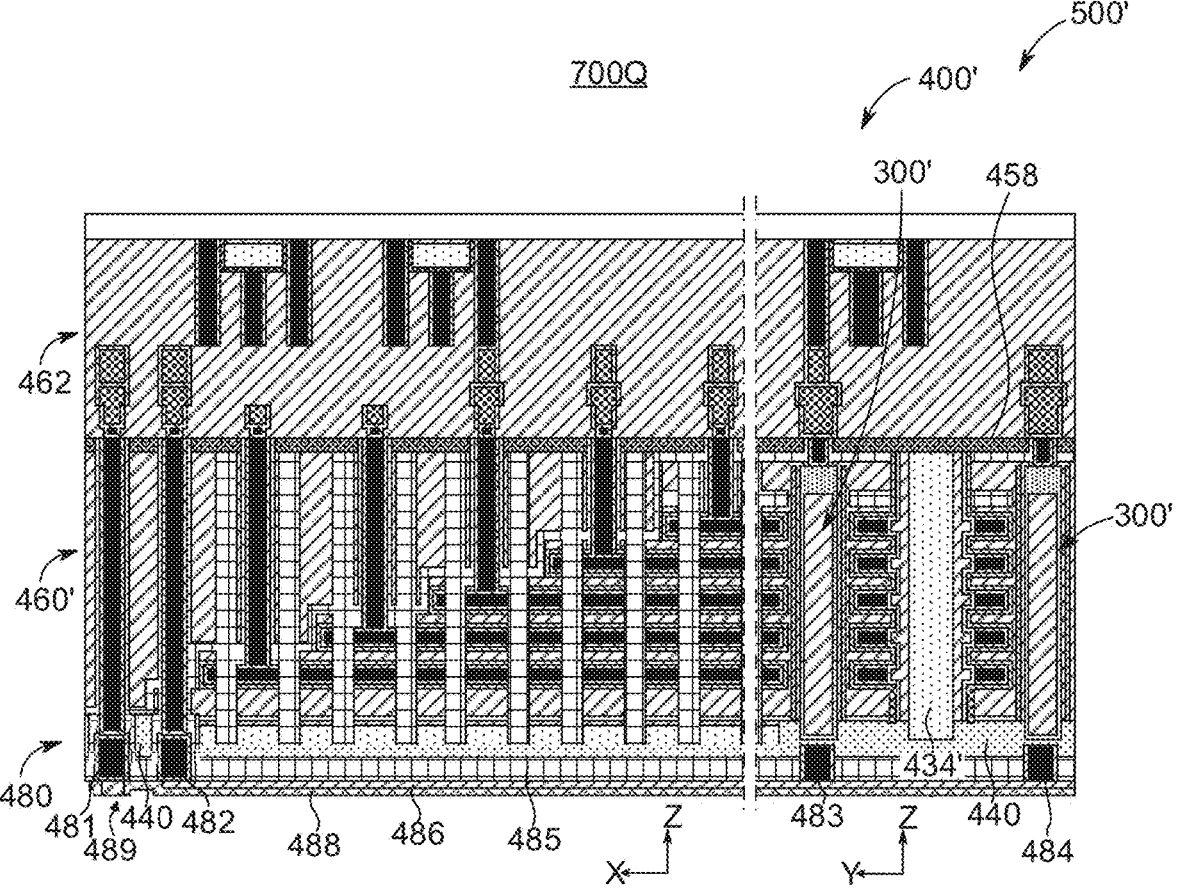

FIGS. 7A through 7Q illustrate manufacturing method 500' for forming 3D memory device 400' shown in FIG. 6, according to exemplary aspects. It is to be appreciated that not all steps in FIGS. 7A through 7Q are needed to perform the disclosure provided herein. Further, some of the steps may be performed simultaneously, sequentially, and/or in a different order than shown in FIGS. 7A through 7Q. Manufacturing method 500' shall be described with reference to FIGS. 7A through 7Q. However, manufacturing method 500' is not limited to those example aspects.

The aspects of manufacturing method 500 shown in FIGS. 5A through 5Q, for example, and the aspects of manufacturing method 500' shown in FIGS. 7A through 7Q may be similar. Similar reference numbers are used to indicate features of the aspects of manufacturing method 500 shown in FIGS. 5A through 5Q and the similar features of the aspects of manufacturing method 500' shown in FIGS. 7A through 7Q. Manufacturing method 500' includes steps 700B and 700K through 700Q shown in FIGS. 7B and 7K through 7Q, with memory strings 300' (e.g., without blocking layer 312c shown in FIGS. 4 and 4A), HKMG stack 580 with conductive layers 506'' of memory array device 460', and backside GLS 434' directly contacting etch stop layer 458 shown in FIG. 6, rather than steps 500B and 500K through 500Q shown in FIGS. 5B and 5K through 5Q, with memory strings 300, conductive layers 506' of memory array device 460, and backside GLS 434 with first and second gate insulating layers 457, 456 disposed between backside GLS and etch stop layer 458 shown in FIG. 4, respectively.

In step 700A, as shown in the example of FIG. 7A, dielectric stack 504 with first dielectric layer 508 (e.g., silicon oxide), second dielectric layer 506 (e.g., silicon nitride), bottom isolation layer 512, and top isolation layer 514 are formed as an alternating dielectric stack atop substrate 502 to form memory array device 560' with frontside 561a and backside 561b.

In step 700B, as shown in the example of FIG. 7B, memory strings 300' with first and second pillars 540, 542 and first and second top contacts 544, 546 are formed in the alternating dielectric stack (e.g., dielectric stack 504). In some aspects, as shown in FIGS. 6A and 7B, memory strings 300' can include insulating layer 312' with tunnel layer 312a and storage layer 312b, where tunnel layer 312a surrounds storage layer 312b. In some aspects, as shown in FIGS. 6A and 7B, conductor layer 416' can include first gate oxide 416a and second gate oxide 416b' (e.g., high-k dielectric layer), where second gate oxide 416b' surrounds first gate oxide 416a and first gate oxide 416a surrounds the conductor (e.g., coupled to word lines 436, 437). In some aspects, as shown in FIG. 7B, insulating layer 312' of memory strings 300' can omit blocking layer 312c shown in FIGS. 4 and 4A and instead utilize second gate oxide 416b' of conductor layer 416'. In some aspects, memory strings 300' can be formed by forming first and second channel (CH) holes (e.g., anisotropic etch) in the alternating dielectric stack and subsequently forming (e.g., depositing), in order, storage layer 312b (e.g., silicon nitride or conductive layer), tunnel layer 312a (e.g., oxide layer), and first and second pillars 540, 542. In some aspects, forming first and second top contacts 544, 546 can include doping first and second pillars 540, 542 (e.g., doping a top portion of channel 310a of pillar 310 shown in FIG. 6A) to form first and second top contacts 544, 542, for example, by ion implanting.

In step 700C, as shown in the example of FIG. 7C, staircase structure 505 and dummy channel holes 515 are formed in alternating dielectric stack (e.g., dielectric stack 504). In some aspects, dummy channel holes 515 can be silicon oxide. In some aspects, dummy channel holes 515 can include a high-k dielectric, an oxide, a nitride, or a combination thereof. In some aspects, staircase structure 505 can be formed by using a step etch stop layer to expose and etch portions of the alternating dielectric stack (e.g., dielectric stack 504) along the Z-direction (e.g., via photolithography and subsequent etching).

In step 700D, as shown in the example of FIGS. 6 and 7D, etch stop layer 558 is formed (e.g., deposited and patterned) on frontside 561a of memory array device 560'. In some aspects, etch stop layer 558 can be patterned (e.g., via photolithography and subsequent etching) to expose portions of etch stop layer 558 corresponding to interconnects (e.g., interconnects 542 shown in FIG. 7F). In some aspects, as shown in FIG. 7D, etch stop layer 558 extends entirely across a distance between adjacent memory strings 300' (e.g., across overlay window 470 shown in FIG. 6.)

In step 700E, as shown in the example of FIG. 7E, interconnect trenches 541 are formed (e.g., anisotropic etch) in the alternating dielectric stack (e.g., dielectric stack 504) corresponding to the exposed areas of etch stop layer 558.

In step 700F, as shown in the example of FIG. 7F, interconnects 542 are formed (e.g., deposited) in interconnect trenches 541 with a conductive material (e.g., polysilicon, tungsten, aluminum, a metal, or any other conductive material).

In step 700G, as shown in the example of FIG. 7G, peripheral device 562 is bonded to frontside 561a of memory array device 560' (e.g., etch stop layer 558). In some aspects, peripheral device 562 is hybrid bonded (e.g., Xtacking) to memory array device 560' to simultaneously bond and connect interconnect contacts between peripheral device 562 and memory array device 560'.

In step 700H, as shown in the example of FIG. 7H, substrate 502 of memory array device 560' is removed (e.g., selective etch, CMP, etc.).

In step 700I, as shown in the example of FIG. 7I, backside gate line trench 550 is formed in the alternating dielectric stack (e.g., dielectric stack 504). In some aspects, backside gate line trench 550 extends through backside 561b of memory array device 560' to etch stop layer 558. In some aspects, etch stop layer 558 stops the etching of backside gate line trench 550 from backside 561b to frontside 561a of memory array device 560 at the etch stop layer 558 (e.g., at the frontside 561a). In some aspects, backside gate line trench 550 can be formed by etching alternating dielectric stack, for example, anisotropic etching.

In step 700J, as shown in the example of FIG. 7J, second dielectric layer 506 (e.g., silicon nitride) of dielectric stack 504 is removed to form dielectric layer void 570. In some aspects, second dielectric layer 506 can be removed by etching from a lateral edge of dielectric stack 504, for example, isotropic etching.

In step 700K, as shown in the example of FIG. 7K, HKMG stack 580 is formed with conductive layers 506" in dielectric layer void 570 and conductive layer 590 is formed in backside gate line trench 550. In some aspects, as shown in FIG. 7K, HKMG stack 580 can include first gate insulating layer 557, second gate insulating layer 556, and third gate insulating layer 555 (e.g., high-k dielectric layer). For example, third gate insulating layer 555, second gate insulating layer 556, first gate insulating layer 557, and conductive layer 590 can be subsequently formed (e.g., deposited), in order, in backside gate line trench 550 such that third gate line insulating layer 555 surrounds second gate line insulating layer 556, second gate line insulating layer 556 surrounds first gate insulating layer 557, and first gate insulating layer 557 surrounds conductive layer 590. In some aspects, third gate insulating layer 555 (e.g., high-k dielectric layer) can be deposited on a sidewall of backside gate line trench 550. In some aspects, first gate line insulating layer 557 can include a high-k dielectric, an oxide, a nitride, or a combination thereof. In some aspects, second gate line insulating layer 556 can include a high-k dielectric, an oxide, a nitride, or a combination thereof. In some aspects, third gate line insulating layer 555 can include a high-k dielectric, an oxide, a nitride, or a combination thereof. For example, as shown in FIG. 7K, third gate line insulating layer 555 can be a high-k dielectric layer. In some aspects, first and second gate insulating layers 557, 556 can be combined into a single insulating layer (e.g., first insulating layer 557). In some aspects, as shown in FIG. 7K, conductive layer 590 can contact frontside 561a of memory array device 560' at etch stop layer 558. In some aspects, conductive layer 590 can include polysilicon, tungsten, aluminum, a metal, or any other conductive material.

In step 700L, as shown in the example of FIG. 7L, a portion of conductive layer 590 is removed (e.g., selective etch) to form etch conductive layer 591 and insulating layer 592 is exposed.

In step 700M, as shown in the example of FIG. 7M, protective cap layer 593 (e.g., oxide) is formed on a bottom portion of etched conductive layer 591 and insulating layer 592 is planarized (e.g., CMP) to form planar edge 594.

In step 700N, as shown in the example of FIGS. 6 and 7N, bottom portions of memory array device 560' are removed (e.g., anisotropic etch) to form bottom interconnect voids 595 corresponding to bottom contacts of memory strings 300', backside GLS 434', and source contacts 440.

In step 700O, as shown in the example of FIGS. 6, 7B, 7O, first and second bottom contacts 596, 598 are formed in bottom portions of memory strings 300'. In some aspects, forming first and second bottom contacts 596, 598 can include doping bottom portions of memory strings 300' (e.g., bottom portions of first and second pillars 540, 542 shown in FIG. 7B), for example, by ion implanting. In some aspects, as shown in FIGS. 6A and 7O, a lower portion of channel 310a of memory strings 300 can be doped (e.g., by ion implanting) to form doped channel 310b to form first and second bottom contacts 596, 598 (e.g., source contacts).

In step 700P, as shown in the example of FIGS. 6 and 7P, source contacts 530 are formed in bottom interconnect voids 595 with a conductive material to connect bottom contacts of memory strings 300' (e.g., first and second bottom contacts 596, 598) and backside GLS 434', and form source contacts 440 of 3D memory device 400' shown in FIG. 6. In some aspects, source contacts 530 can include polysilicon, tungsten, aluminum, a metal, or any other conductive material. In some aspects, manufacturing method 500' can include forming a 3D memory device, for example, 3D memory device 400' with backside GLS 434' shown in FIG. 6.

Figure 8:
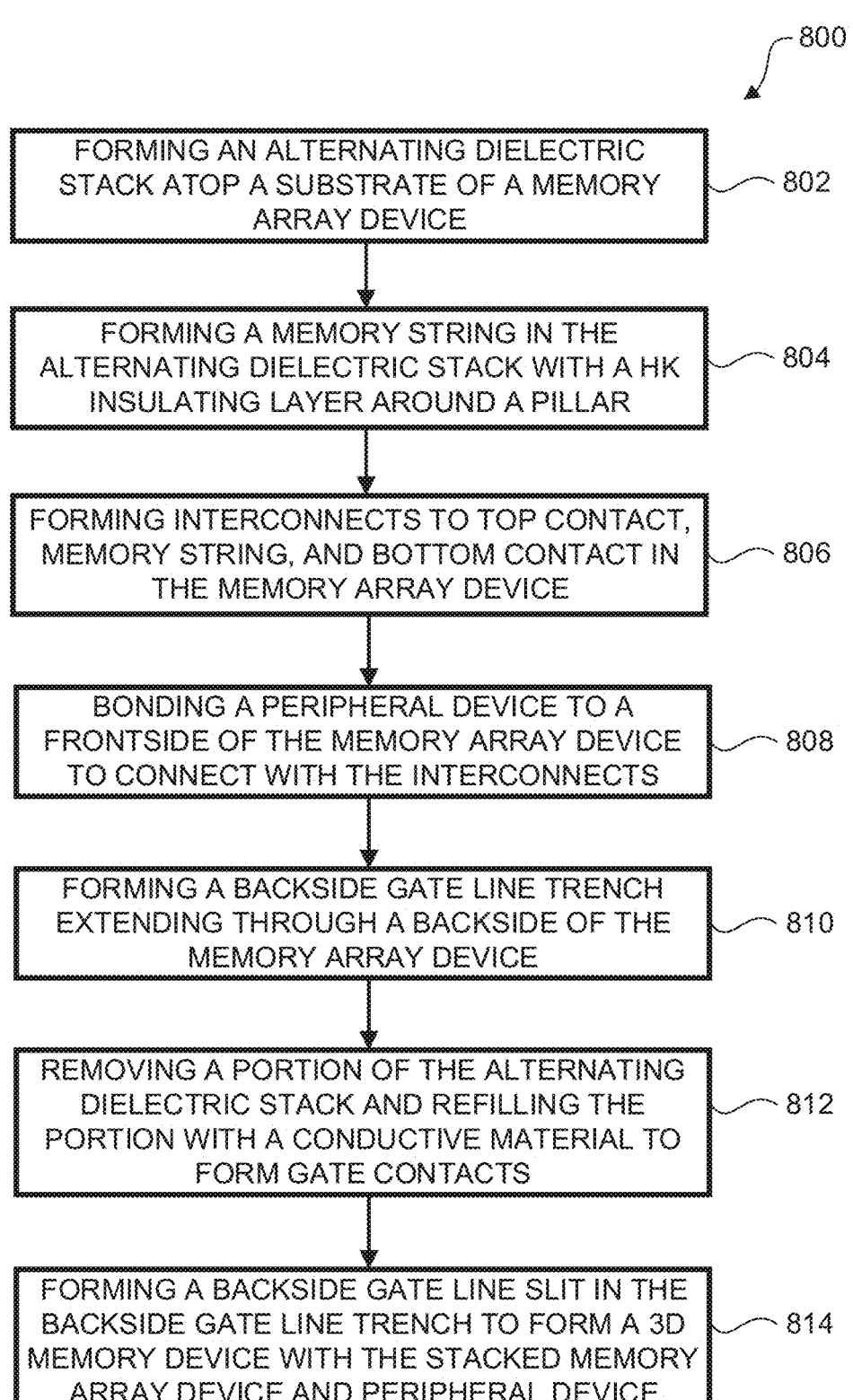
FIG. 8 illustrates a flow diagram for forming the 3D memory device shown in FIG. 4, according to an exemplary aspect.

In step 700Q, as shown in the example of FIG. 7Q, pad interconnect 481, ACS interconnects 482, 483, 484, isolating layer 485, ACS connection layer 486, protective layer 488, and contact pad 489 can be formed on a bottom portion of memory array device 460' to form pad-out interconnection layer 480. In some aspects, manufacturing method 500' can include forming a memory string, for example, memory string 300' shown in FIG. 6. In some aspects, manufacturing method 500' can include forming a NAND memory string.
Exemplary Flow Diagrams FIG. 8 illustrates flow diagram 800 for forming 3D memory device 400 shown in FIG. 4, according to exemplary aspects. It is to be appreciated that not all steps in FIG. 8 are needed to perform the disclosure provided herein. Further, some of the steps may be performed simultaneously, sequentially, and/or in a different order than shown in FIG. 8. Flow diagram 800 shall be described with reference to FIGS. 4 and 5A through 5Q. However, flow diagram 800 is not limited to those example aspects.

In step 802, as shown in the example of FIG. 5A, dielectric stack 504 with first dielectric layer 508 (e.g., silicon oxide), second dielectric layer 506 (e.g., silicon nitride), bottom isolation layer 512, and top isolation layer 514 are formed as an alternating dielectric stack atop substrate 502 to form memory array device 560 with frontside 561a and backside 561b.

In step 804, as shown in the example of FIG. 5B, memory strings 300 with first and second pillars 540, 542 and first and second top contacts 544, 546 are formed in the alternating dielectric stack (e.g., dielectric stack 504). In some aspects, as shown in FIG. 5B, memory strings 300 can include pillar 310 and insulating layer 312 with tunnel layer 312a, storage layer 312b, and blocking layer 312c.

In step 806, as shown in the example of FIGS. 5C through 5F, staircase structure 505 and dummy channel holes 515 are formed in alternating dielectric stack (e.g., dielectric stack 504). Further, etch stop layer 558 is formed (e.g., deposited and patterned) on frontside 561a of memory array device 560.

In step 808, as shown in the example of FIG. 5G, peripheral device 562 is bonded to frontside 561a of memory array device 560 (e.g., along etch stop layer 558). In some aspects, peripheral device 562 is hybrid bonded (e.g., Xtacking) to memory array device 560 to simultaneously bond and connect interconnect contacts between peripheral device 562 and memory array device 560.

In step 810, as shown in the example of FIGS. 5H and 5I, substrate 502 of memory array device 560 is removed (e.g., selective etch, CMP, etc.). Further, backside gate line trench 550 is formed in the alternating dielectric stack (e.g., dielectric stack 504). In some aspects, backside gate line trench 550 extends through backside 561b of memory array device 560 to etch stop layer 558. In some aspects, backside gate line trench 550 can be formed by etching alternating dielectric stack, for example, anisotropic etching.

In step 812, as shown in the example of FIGS. 5J and 5K, second dielectric layer 506 (e.g., silicon nitride) of dielectric stack 504 is removed to form dielectric layer void 570 (e.g., a hole). In some aspects, second dielectric layer 506 can be removed by etching from a lateral edge of dielectric stack 504, for example, isotropic etching. Further, conductive layers 506' are formed in dielectric layer void 570 and conductive layer 590 is formed in backside gate line trench 550. In some aspects, conductive layer 590 can include polysilicon, tungsten, aluminum, a metal, or any other conductive material.

In step 814, as shown in the example of FIGS. 4 and 5L through 5Q, a portion of conductive layer 590 is removed (e.g., selective etch) and insulating layer 592 is exposed. Further, protective cap layer 593 (e.g., oxide) is formed on a bottom portion of conductive layer 590 and insulating layer 592 is planarized (e.g., CMP) to form planar edge 594. Further, bottom portions of memory array device 560 are removed (e.g., anisotropic etch) to form bottom interconnect voids 595 corresponding to bottom contacts of memory strings 300, backside GLS 434, and source contacts 440. Further, first and second bottom contacts 596, 598 are formed in bottom portions of memory strings 300. Further, pad-out interconnection layer 480 is formed on a bottom portion of memory array device 460. In some aspects, forming first and second bottom contacts 596, 598 can include doping bottom portions of memory strings 300 (e.g., bottom portions of first and second pillars 540, 542 shown in FIG. 5B), for example, by ion implanting. Further, source contacts 530 are formed in bottom interconnect voids 595 with a conductive material to connect bottom contacts of memory strings 300 (e.g., first and second bottom contacts 596, 598), backside GLS 434, and source contacts 440. In some aspects, source contacts 530 can include polysilicon, tungsten, aluminum, a metal, or any other conductive material. In some aspects, flow diagram 800 can include forming a 3D memory device, for example, 3D memory device 400 with backside GLS 434 shown in FIG. 4. In some aspects, flow diagram 800 can include forming a memory string, for example, memory string 300 shown in FIG. 4. In some aspects, flow diagram 800 can include forming a NAND memory string.

FIG. 9 illustrates flow diagram 900 for forming 3D memory device 400' shown in FIG. 6, according to exemplary aspects. It is to be appreciated that not all steps in FIG. 9 are needed to perform the disclosure provided herein. Further, some of the steps may be performed simultaneously, sequentially, and/or in a different order than shown in FIG. 9. Flow diagram 900 shall be described with reference to FIGS. 6 and 7A through 7P. However, flow diagram 900 is not limited to those example aspects.

In step 902, as shown in the example of FIG. 7A, dielectric stack 504 with first dielectric layer 508 (e.g., silicon oxide), second dielectric layer 506 (e.g., silicon nitride), bottom isolation layer 512, and top isolation layer 514 are formed as an alternating dielectric stack atop substrate 502 to form memory array device 560' with frontside 561a and backside 561b.

In step 904, as shown in the example of FIG. 7B, memory strings 300' with first and second pillars 540, 542 and first and second top contacts 544, 546 are formed in the alternating dielectric stack (e.g., dielectric stack 504). In some aspects, as shown in FIG. 7B, memory strings 300' can include pillar 310 and insulating layer 312' with tunnel layer 312a and storage layer 312b. In step 906, as shown in the example of FIGS. 7C through 7F, staircase structure 505 and dummy channel holes 515 are formed in alternating dielectric stack (e.g., dielectric stack 504). Further, etch stop layer 558 is formed (e.g., deposited and patterned) on frontside 561*a* of memory array device 560'.

In step 908, as shown in the example of FIG. 7G, peripheral device 562 is bonded to frontside 561*a* of memory array device 560' (e.g., along etch stop layer 558). In some aspects, peripheral device 562 is hybrid bonded (e.g., Xtacking) to memory array device 560' to simultaneously bond and connect interconnect contacts between peripheral device 562 and memory array device 560'.

In step 910, as shown in the example of FIGS. 7H and 7I, substrate 502 of memory array device 560' is removed (e.g., selective etch, CMP, etc.). Further, backside gate line trench 550 is formed in the alternating dielectric stack (e.g., dielectric stack 504). In some aspects, backside gate line trench 550 extends through backside 561*b* of memory array device 560' to etch stop layer 558. In some aspects, backside gate line trench 550 can be formed by etching alternating dielectric stack, for example, anisotropic etching.

In step 912, as shown in the example of FIGS. 7J and 7K, second dielectric layer 506 (e.g., silicon nitride) of dielectric stack 504 is removed to form dielectric layer void 570 (e.g., a hole). In some aspects, second dielectric layer 506 can be removed by etching from a lateral edge of dielectric stack 504, for example, isotropic etching. Further, HKMG stack 580 is formed with conductive layers 506" in dielectric layer void 570 and conductive layer 590 is formed in backside gate line trench 550. In some aspects, conductive layer 590 can include polysilicon, tungsten, aluminum, a metal, or any other conductive material.

In step 914, as shown in the example of FIGS. 6 and 7L through 7Q, a portion of conductive layer 590 is removed (e.g., selective etch) and insulating layer 592 is exposed. Further, protective cap layer 593 (e.g., oxide) is formed on a bottom portion of conductive layer 590 and insulating layer 592 is planarized (e.g., CMP) to form planar edge 594. Further, bottom portions of memory array device 560' are removed (e.g., anisotropic etch) to form bottom interconnect voids 595 corresponding to bottom contacts of memory strings 300', backside GLS 434', and source contacts 440. Further, first and second bottom contacts 596, 598 are formed in bottom portions of memory strings 300'. Further, pad-out interconnection layer 480 is formed on a bottom portion of memory array device 460'. In some aspects, forming first and second bottom contacts 596, 598 can include doping bottom portions of memory strings 300' (e.g., bottom portions of first and second pillars 540, 542 shown in FIG. 7B), for example, by ion implanting. Further, source contacts 530 are formed in bottom interconnect voids 595 with a conductive material to connect bottom contacts of memory strings 300' (e.g., first and second bottom contacts 596, 598), backside GLS 434', and source contacts 440. In some aspects, source contacts 530 can include polysilicon, tungsten, aluminum, a metal, or any other conductive material. In some aspects, flow diagram 800 can include forming a 3D memory device, for example, 3D memory device 400' with backside GLS 434' shown in FIG. 6. In some aspects, flow diagram 900 can include forming a memory string, for example, memory string 300' shown in FIG. 6. In some aspects, flow diagram 900 can include forming a NAND memory string.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some aspects, the substrate itself may be patterned and materials added on top of it may also be patterned, or may remain without patterning.

The following examples are illustrative, but not limiting, of the aspects of this disclosure. Other suitable modifications and adaptations of the variety of conditions and parameters normally encountered in the field, and which would be apparent to those skilled in the relevant art(s), are within the spirit and scope of the disclosure.

While specific aspects have been described above, it will be appreciated that the aspects may be practiced otherwise than as described. The description is not intended to limit the scope of the claims.

It is to be appreciated that the Detailed Description section, and not the Summary and Abstract sections, is intended to be used to interpret the claims. The Summary and Abstract sections may set forth one or more but not all exemplary aspects as contemplated by the inventor(s), and thus, are not intended to limit the aspects and the appended claims in any way.

The aspects have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific aspects will so fully reveal the general nature of the aspects that others can, by applying knowledge within the skill of the art, readily modify and/or adapt for various applications such specific aspects, without undue experimentation, without departing from the general concept of the aspects. Therefore, such adaptations and modifications are intended to be within the meaning and range of equivalents of the disclosed aspects, based on the teaching and guidance presented herein.

The breadth and scope of the aspects should not be limited by any of the above-described exemplary aspects, but should be defined only in accordance with the following claims and their equivalents.

What is claimed is:

1. A three-dimensional memory device comprising:
a memory array device having a frontside and a backside, the memory array device comprising a plurality of memory strings coupled to a plurality of word lines in a staircase structure;
an etch stop layer disposed on the frontside of the memory array device;
a peripheral device disposed on the etch stop layer, the etch stop layer being between the memory array device and the peripheral device; and
a backside gate line slit extending through the backside of the memory array device to the etch stop layer, the backside gate line slit comprising a conductive gate line layer and an insulating gate line layer, wherein a cross-sectional diameter of the backside gate line slit decreases from the backside of the memory array device towards the frontside of the memory array device, and wherein a cross-sectional diameter of each of the plurality of memory strings increases from the backside of the memory array device towards the frontside of the memory array device.

2. The three-dimensional memory device of claim 1, wherein the insulating gate line layer is between the etch stop layer and the conductive gate line layer.

3. The three-dimensional memory device of claim 1, further comprising an array common source coupled to the plurality of memory strings and the backside gate line slit.

4. The three-dimensional memory device of claim 3, wherein the insulating gate line layer is between the conductive gate line layer and the array common source.

5. The three-dimensional memory device of claim 1, wherein the insulating gate line layer comprises a high-k dielectric layer.

6. The three-dimensional memory device of claim 1, wherein the plurality of word lines each comprises a word line insulating layer, the word line insulating layer comprising a high-k dielectric layer.

7. The three-dimensional memory device of claim 1, wherein the plurality of memory strings each comprises a pillar and an insulating layer surrounding the pillar, the insulating layer comprising a high-k dielectric layer.

8. The three-dimensional memory device of claim 1, further comprising a pad-out interconnection layer coupled to the backside of the memory array device.

9. The three-dimensional memory device of claim 1, wherein the etch stop layer comprises a thickness in a range of about 5 nm to about 50 nm.

10. A method for forming a three-dimensional memory device, the method comprising the steps of:

(a) forming a plurality of memory strings through a dielectric stack;

(b) forming a staircase structure in the dielectric stack to form a memory array device having a frontside and a backside, wherein a cross-sectional diameter of each of the plurality of memory strings increases from the backside of the memory array device towards the frontside of the memory array device;

(c) forming an etch stop layer on the frontside of the memory array device;

(d) forming a plurality of interconnections through the etch stop layer to the plurality of memory strings and the staircase structure of the memory array device;

(e) bonding a peripheral device above the memory array device to the plurality of interconnections; and (f) forming a backside gate line slit extending through the backside of the memory array device to the etch stop layer, the backside gate line slit comprising a conductive gate line layer and an insulating gate line layer, wherein a cross-sectional diameter of the backside gate line slit decreases from the backside of the memory array device towards the frontside of the memory array device.

11. The method of claim 10, wherein forming the backside gate line slit comprises forming the insulating gate line layer between the etch stop layer and the conductive gate line layer.

12. The method of claim 10, further comprising forming an array common source coupled to the plurality of memory strings and the backside gate line slit.

13. The method of claim 12, wherein forming the backside gate line slit comprises forming the insulating gate line layer between the conductive gate line layer and the array common source.

14. The method of claim 10, wherein forming the backside gate line slit comprises forming the insulating gate line layer with a high-k dielectric layer.

15. The method of claim 10, wherein forming the backside gate line slit comprises forming a plurality of word lines in the staircase structure, the plurality of word lines coupled to the plurality of interconnections.

16. The method of claim 15, wherein forming the plurality of word lines comprises forming a word line insulating layer comprising a high-k dielectric layer.

17. The method of claim 10, wherein forming the plurality of memory strings comprises forming a pillar and an insulating layer surrounding the pillar.

18. The method of claim 17, wherein the insulating layer comprises a high-k dielectric layer.

19. The method of claim 10, further comprising forming a pad-out interconnection layer coupled to the backside of the memory array device.

20. The method of claim 10, wherein forming the etch stop layer with a thickness in a range of about 5 nm to about 50 nm.

\* \* \* \* \*